(12) United States Patent
Levy

(10) Patent No.: US 7,456,429 B2
(45) Date of Patent: Nov. 25, 2008

(54) APPARATUS FOR ATOMIC LAYER DEPOSITION

(75) Inventor: David H. Levy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 427 days.

(21) Appl. No.: 11/392,006

(22) Filed: Mar. 29, 2006

(65) Prior Publication Data
US 2007/0228470 A1  Oct. 4, 2007

(51) Int. Cl.
*H01L 29/76* (2006.01)
*C23C 16/00* (2006.01)

(52) U.S. Cl. ........................................ 257/66; 118/728

(58) Field of Classification Search ......... 438/149–153, 438/384, 680; 257/66–71; 118/715, 728
See application file for complete search history.

(56) References Cited

U.S. PATENT DOCUMENTS 4,413,022 A  11/1983  Suntola et al.
6,015,590 A *  1/2000  Suntola et al. ......... 427/255.23
6,551,406 B2 *  4/2003  Kilpi ........................... 118/728
6,821,563 B2  11/2004  Yudovsky
2004/0067641 A1  4/2004  Yodovsky
2004/0216665 A1  11/2004  Soininen et al.
2005/0084610 A1  4/2005  Selitser

FOREIGN PATENT DOCUMENTS

EP  1 283 279 A2  2/2003

\* cited by examiner

*Primary Examiner*—Calvin Lee

(57) ABSTRACT

The present invention provides a distribution manifold for thin-film material deposition onto a substrate comprising a plurality of inlet ports for a sequence of gaseous materials, an output face comprising a plurality of open elongated output channels, each channel extending in a length direction substantially in parallel. The distribution manifold can be employed in a deposition system for thin film deposition, further comprising a plurality of sources for a plurality of gaseous materials and a support for positioning a substrate in pre-designed close proximity to the output face of the distribution manifold. During operation of the system, relative movement between the output face and the substrate support is accomplished.

33 Claims, 20 Drawing Sheets

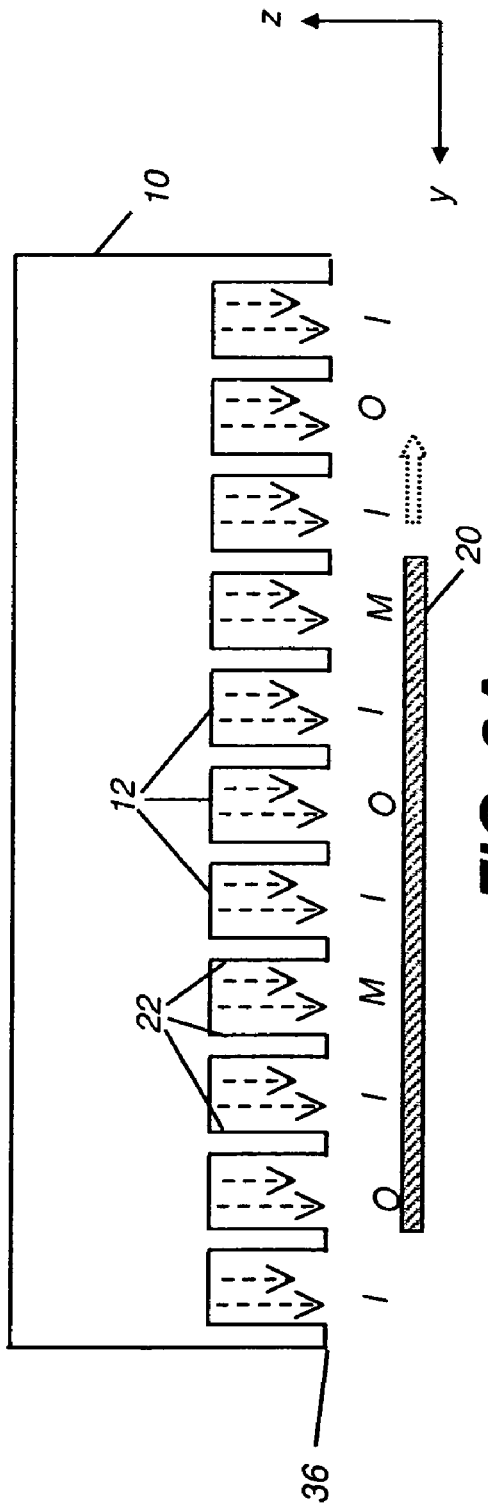
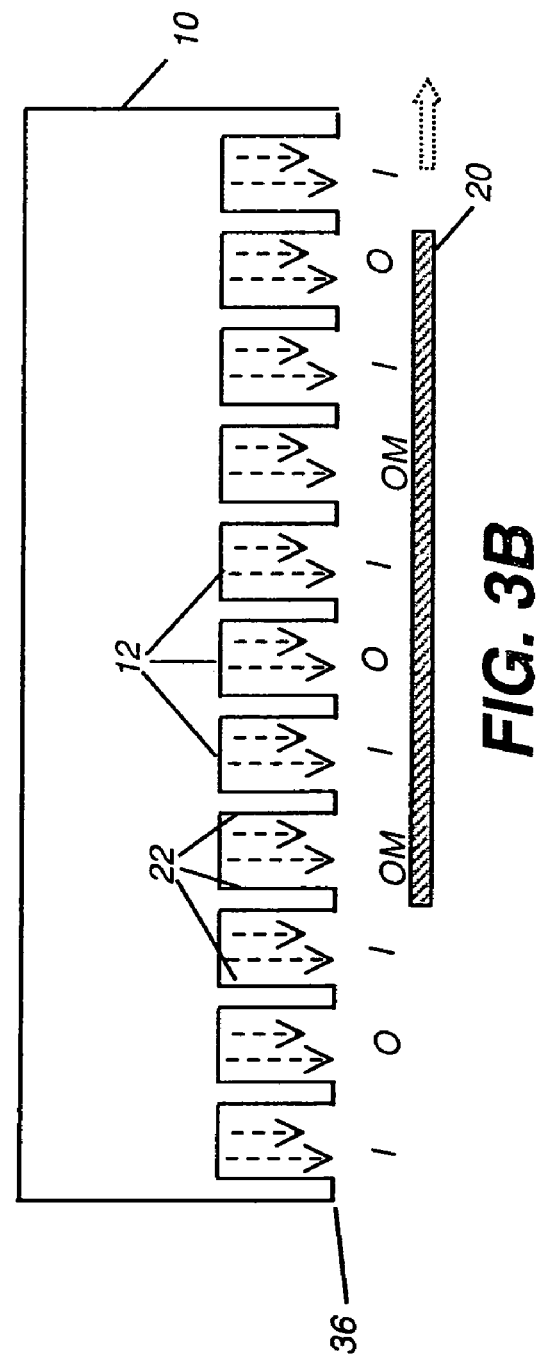

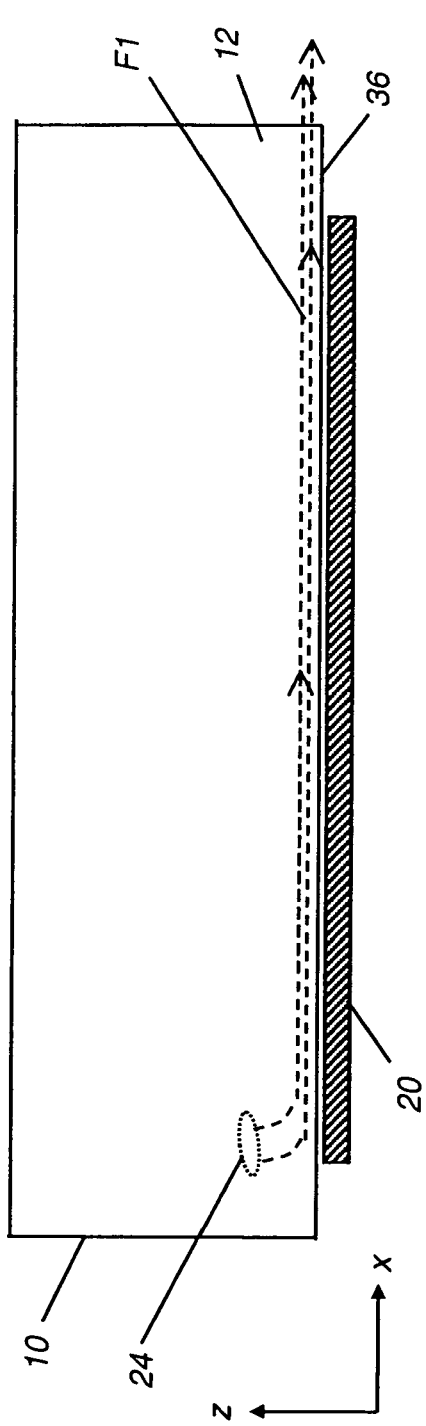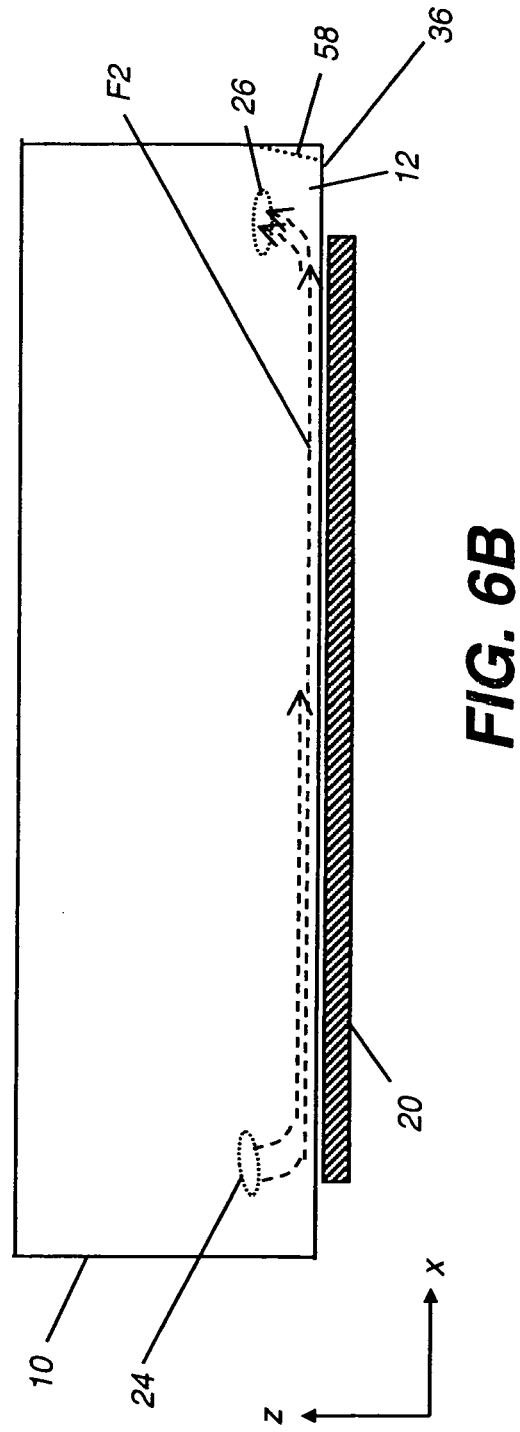

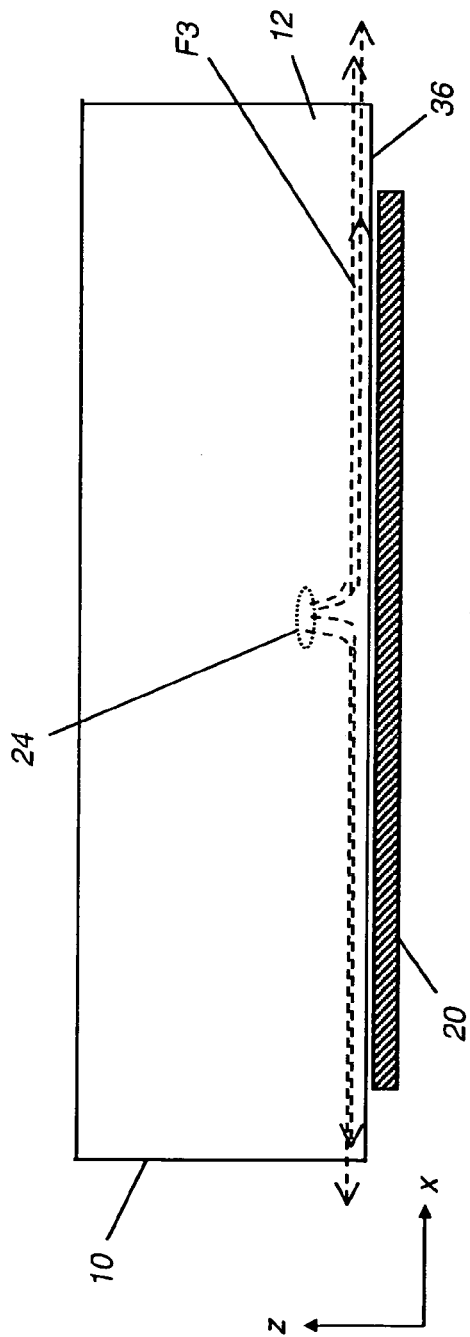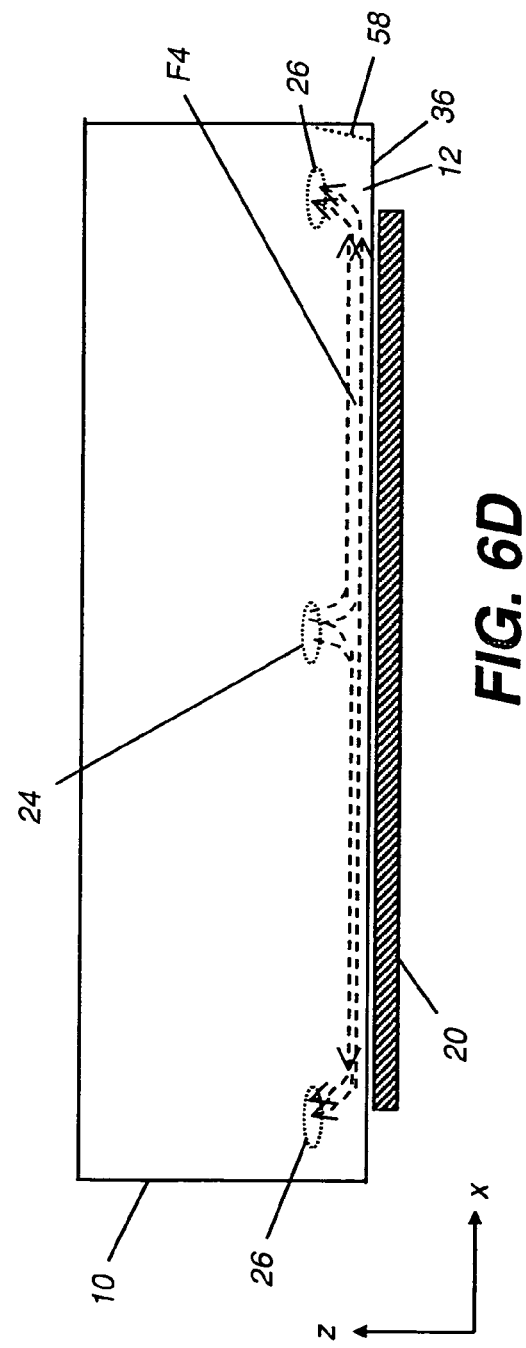

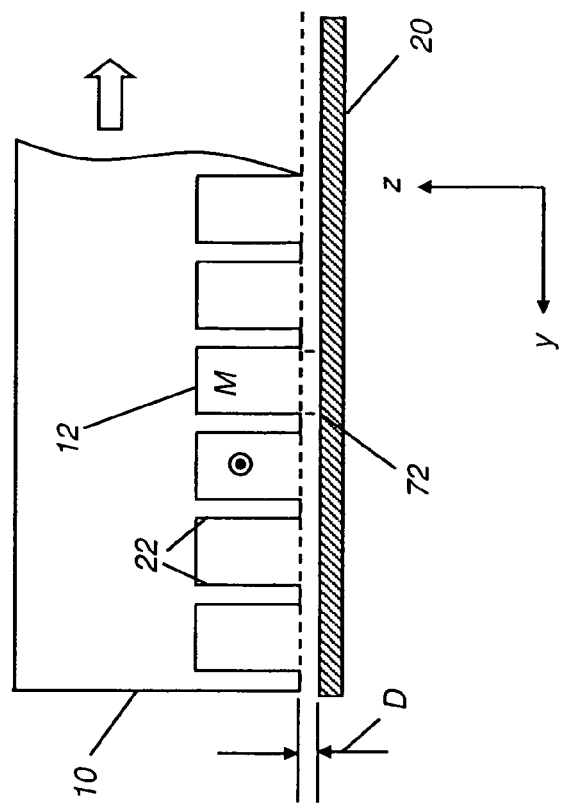
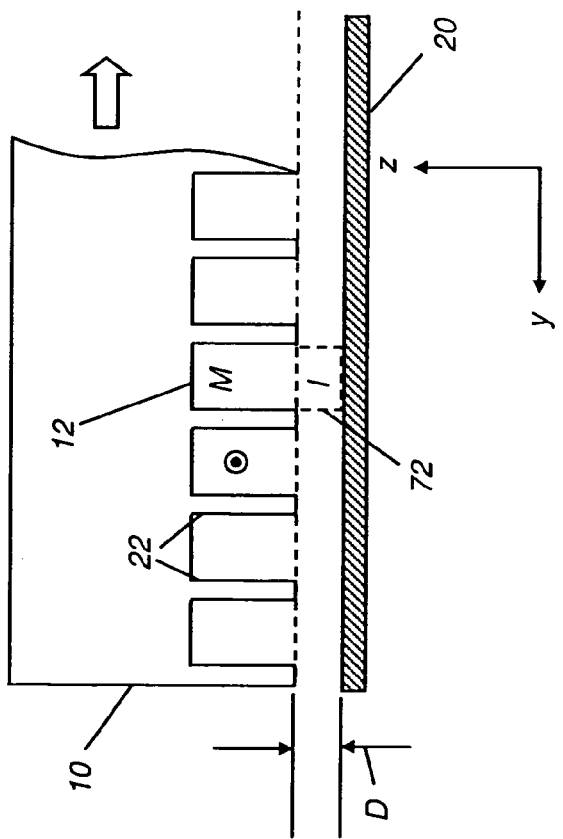

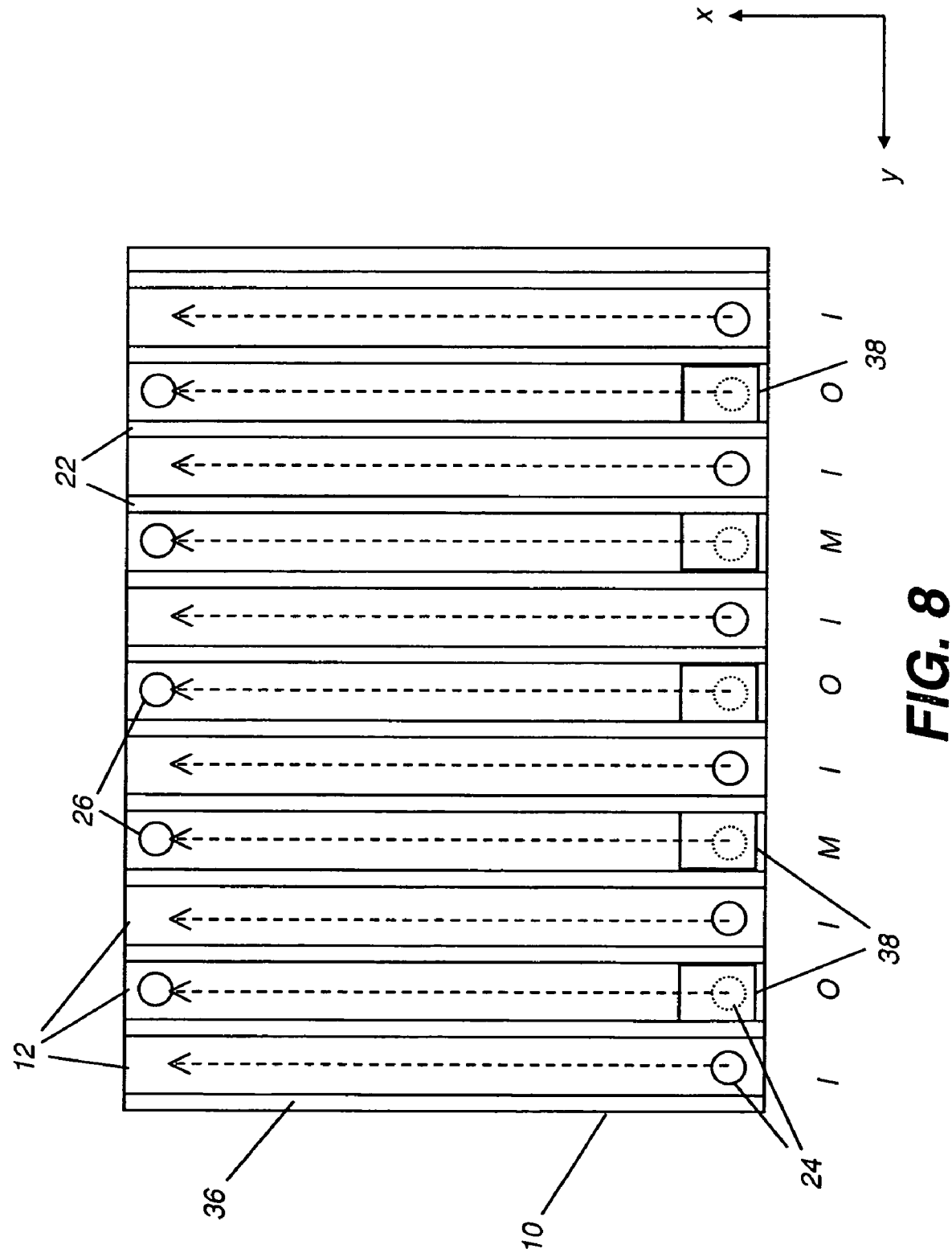

APPARATUS FOR ATOMIC LAYER DEPOSITION

CROSS-REFERENCE TO RELATED APPLICATIONS

The present application is related to U.S. Publication Number 2008/08997, filed concurrently herewith by Levy et al. and entitled, "PROCESS FOR ATOMIC LAYER DEPOSITION."

FIELD OF THE INVENTION

This invention generally relates to the deposition of thin-film materials and, more particularly, to apparatus for atomic layer deposition onto a substrate using a distribution manifold allowing transverse gas flow across a substrate.

BACKGROUND OF THE INVENTION

Among the techniques widely used for thin-film deposition are Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductor, integrated circuit, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition ("ALD") is an alternative film deposition technology that can provide improved thickness resolution and conformal capabilities, compared to its CVD predecessor. The ALD process segments the conventional thin-film deposition process of conventional CVD into single atomic-layer deposition steps. Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate, when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \quad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all the initial AH ligands on the surface are replaced with $AML_{x-1}$ species. The reaction stage is typically followed by an inert-gas purge stage that eliminates the excess metal precursor from the chamber prior to the separate introduction of the other precursor.

A second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \quad (2)$$

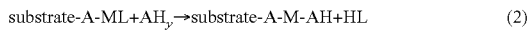

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

ALD can be used as a fabrication step for forming a number of types of thin-film electronic devices, including semiconductor devices and supporting electronic components such as resistors and capacitors, insulators, bus lines and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent conductors such as indium-tin oxide (ITO), ZnO, $SnO_2$, or $In_2O_3$. The thickness of the conductor may vary, and according to particular examples it can range from about 50 to about 1000 nm.

A dielectric electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as a dielectrics. Of these materials, aluminum oxides are preferred.

A dielectric structure layer may comprise two or more layers having different dielectric constants. Such insulators are discussed in U.S. Pat. No. 5,981,970 hereby incorporated by reference and copending U.S. application Ser. No. 11/088,645, hereby incorporated by reference. Dielectric materials typically exhibit a band-gap of greater than about 5 eV. The thickness of a useful dielectric layer may vary, and according to particular examples it can range from about 10 to about 300 nm.

Examples of useful semiconducting materials are compound semiconductors such as gallium arsenide, gallium nitride, cadmium sulfide, zinc oxide, and zinc sulfide.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

A semiconductor material, for use in an atmospheric process, must display several characteristics. In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the charge carrier concentration. Furthermore, it is desired that the device be weakly or not at all influenced by visible light. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, in a real high volume web based atmospheric manufacturing scheme, it is highly desirable that the chemistries used in the process be both cheap and of low toxicity, which can be satisfied by the use of ZnO and the majority of its precursors.

The semiconductor films made according to the present method exhibit a field effect electron mobility that is greater than $0.01$ $cm^2/Vs$, preferably at least $0.1$ $cm^2/Vs$, more preferably greater than $0.2$ $cm^2/Vs$. In addition, n-channel semiconductor films made according to the present invention are capable of providing on/off ratios of at least $10^4$, advantageously at least $10^5$. The on/off ratio is measured as the maximum/minimum of the drain current as the gate voltage is swept from one value to another that are representative of relevant voltages which might be used on the gate line of a display. A typical set of values would be −10V to 40V with the drain voltage maintained at 30V.

Self-saturating surface reactions make ALD insensitive to transport non-uniformities, which might otherwise impair surface uniformity, due either to engineering tolerances and the limitations of the flow system or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide an uniform film thickness in a range of about from 3 nm to 30 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

ALD offers considerable promise for providing a controlled level of highly uniform thin film deposition. However, in order to take advantage of its inherent capabilities a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly pulse the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, τ, are proportional to the volume of the reactor, V, the pressure, P, in the ALD reactor, and the inverse of the flow, Q, that is:

$$\tau = VP/Q \tag{3}$$

Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of "pulsed" delivery of gaseous material is to provide each reactant gas continuously and to move the substrate through each gas in succession. For example, U.S. Pat. No. 6,821,563 entitled "GAS DISTRIBUTION SYSTEM FOR CYCLICAL LAYER DEPOSITION" to Yudovsky describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings, Diffusion barriers are formed by a carrier gas opening between exhaust openings. Suntola et al. state that operation with such an embodiment is possible even at atmospheric pressure, although little or no details of the process, or examples, are provided.

While systems such as those described in the '563 Yudovsky and '022 Suntola et al. disclosures may avoid some of the difficulties inherent to pulsed gas approaches, these systems have other drawbacks. Driving the gas flow directly toward the surface in a vertical direction, as described in both of these disclosures, invites barrier layer effects that complicate gas flow and can cause unwanted mixing. Both the gas flow delivery unit of the '563 Yudovsky disclosure and the gas flow array of the '022 Suntola et al. disclosure require vacuum ports for exhausting spent gases, positioned between the gas supply ports. This prevents these devices from being compact and increases the needed travel distance of the substrate in order to effect ALD exposure. Moreover, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky disclosure nor the gas flow array of the '022 Suntola et al. disclosure can be used in closer proximity to the substrate than about 0.5 mm, due to the need to maintain gas flows in the vertical direction (that is, normal to the substrate surface). The complex arrangements of both the gas flow delivery unit of the '563 Yudovsky disclosure and the gas flow array of the '022 Suntola et al. disclosure, each providing both gas flow and vacuum, make these solutions difficult to implement and costly to scale and limit their potential usability to deposition applications onto a moving substrate of limited dimensions.

U.S. Patent Pub. No. 2005/0084610 to Selitser discloses an atmospheric pressure atomic layer chemical vapor deposition process. Selitser et al. state that extraordinary increases in reaction rates are obtained by changing the operating pressure to atmospheric pressure, which will involve orders of magnitude increase in the concentration of reactants, with consequent enhancement of surface reactant rates. The embodiments of Selitser et al. involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser et al., although they state that spacing of the injectors is selected so that cross-contamination from adjacent injectors is prevented by purging gas flows and exhaust manifolds incorporate in each injector.

For higher throughput and lower fabrication costs, there would be particular advantages to an ALD system that allows thin film deposition onto large surfaces or onto a moving web. Conventional designs for ALD apparatus, however, would not easily offer this flexibility. For example, conventional approaches offer little promise of obtaining an ALD gas distribution apparatus that could be transported across the surface of a larger substrate or web arrangement.

Thus, a need exists for an ALD apparatus that can achieve short reaction times and good chemical utilization efficiency, can be adaptable for use with larger size substrates, is suitable for high-speed operation, including preferred processes at or near atmospheric pressure, and that can be produced and operated economically.

SUMMARY OF THE INVENTION

The present invention provides a distribution manifold for thin-film material deposition onto a substrate comprising:

(a) a plurality of input ports comprising at least a first, second, and third input/inlet port capable of receiving first, second, and third gaseous materials, respectively; and (b) an output face comprising a plurality of open elongated output channels, each channel extending in a length direction substantially in parallel, the output channels comprising at least a first, second, and third output channel wherein the output channels are adjacent to each other along the output face, each output channel having an output port, wherein each output port, which is used to provide a flow of gaseous material to the corresponding output channel, allows gaseous flow communication with one of the first, second, or third inlet ports and is capable of substantially directing flow of the corresponding one of the first, second, or third gaseous materials along the length direction of the output channel towards an end of the output channel whereby the gaseous material is exhausted from the output channel at a position displaced along the length of the output channel from the output port.

The distribution manifold can be employed in a deposition system for thin film deposition onto a substrate comprising:

(a) a plurality of sources for, respectively, a plurality of gaseous materials comprising at least first, second, and third sources for first, second, and third gaseous materials, respectively;

(b) a distribution manifold as described above; and (c) a substrate support for supporting a substrate in predesigned close proximity to the output face of the distribution manifold, wherein, during operation of the system, relative movement between the output face and the substrate is accomplished while maintaining the predesigned close proximity.

In one embodiment, the system provides a relative oscillating motion between the distribution manifold and the substrate. In a preferred embodiment, the system can be operated with continuous movement of a substrate being subjected to thin film deposition, wherein the system is capable of conveying the support on or as a web past the distribution manifold, preferably in an unsealed environment to ambient at substantially atmospheric pressure.

It is an advantage of the present invention that it provides a compact apparatus for atomic layer deposition onto a substrate, well suited to a number of different types of substrates and deposition environments.

It is a further advantage of the present invention that it allows operation, in preferred embodiments, under atmospheric pressure conditions.

It is yet a further advantage of the present invention that it is adaptable for deposition on a web or other moving substrate, including deposition onto a large area substrate.

It is still a further advantage of the present invention that it can be employed in low temperature processes at atmospheric pressures, which process may be practice in an unsealed environment, open to ambient atmosphere.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 3A and 3B are cross-sectional side views of one embodiment of a distribution manifold, schematically showing the accompanying deposition operation;

FIGS. 6A, 6B, 6C, and 6D are cross-sectional views taken orthogonally to the cross sectional views of previous FIGS. 1-3B, showing gas flow directions for output channels in various embodiments;

FIGS. 7A and 7B are cross-section views of a portion of one embodiment of a distribution manifold, showing an advantage of reduced distance from the output face, of the distribution manifold, to the substrate surface;

FIG. 8 is a plan view of the output face of a distribution manifold according to FIG. 2 showing an arrangement of output channels in one embodiment;

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The apparatus of the present invention offers a significant departure from conventional approaches to ALD, employing a compact distribution device for delivery of gaseous materials to a substrate surface, adaptable to deposition on larger and web-based substrates and capable of achieving a highly uniform thin-film deposition at improved throughput speeds. The apparatus and method of the present invention employs a continuous (as opposed to pulsed) gaseous material distribution. The apparatus of the present invention allows operation at atmospheric or near-atmospheric pressures as well as under vacuum and is capable of operating in an unsealed or open-air environment.

Figure 1:
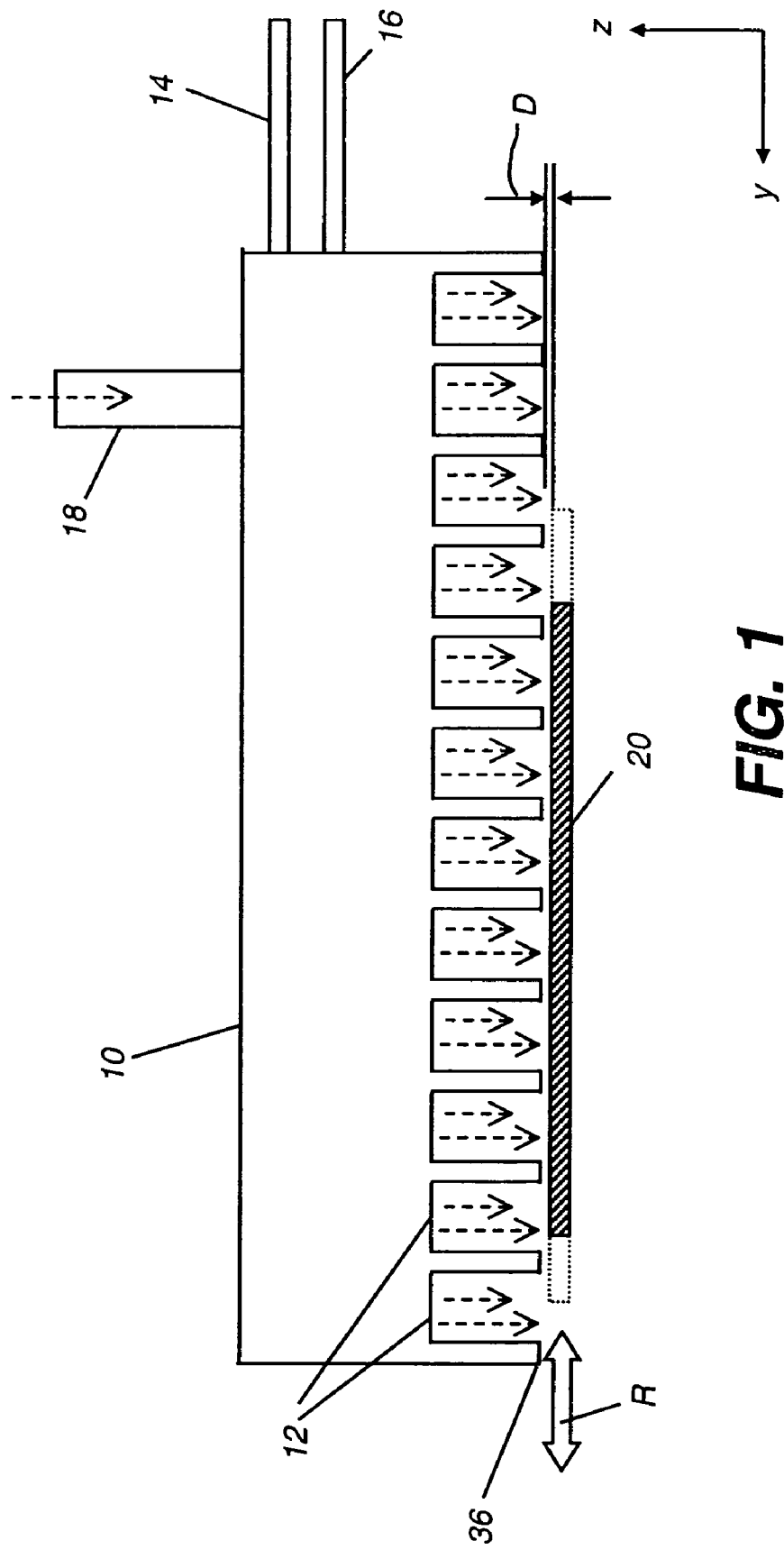
FIG. 1 is a cross-sectional side view of one embodiment of a distribution manifold for atomic layer deposition according to the present invention.

Referring to FIG. 1, there is shown a cross-sectional side view of one embodiment of a distribution manifold 10 for atomic layer deposition onto a substrate 20 according to the present invention. Distribution manifold 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 1 and subsequent FIGS. 2-3B refer to the diffusive transport of the gaseous material, and not the flow, received from an output channel. The flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Distribution manifold 10 is spaced a distance D from substrate 20, provided on a substrate support, as described in more detail subsequently. Reciprocating motion can be provided between substrate 20 and distribution manifold 10, either by movement of substrate 20, by movement of distribution manifold 10, or by movement of both substrate 20 and distribution manifold 10. In the particular embodiment shown in FIG. 1, substrate 20 is moved across output face 36 in reciprocating fashion, as indicated by the arrow R and by phantom outlines to the right and left of substrate 20 in FIG. 1. It should be noted that reciprocating motion is not always required for thin-film deposition using distribution manifold 10. Other types of relative motion between substrate 20 and distribution manifold 10 could also be provided, such as movement of either substrate 20 or distribution manifold 10 in one or more directions, as described in more detail subsequently.

Figure 2:
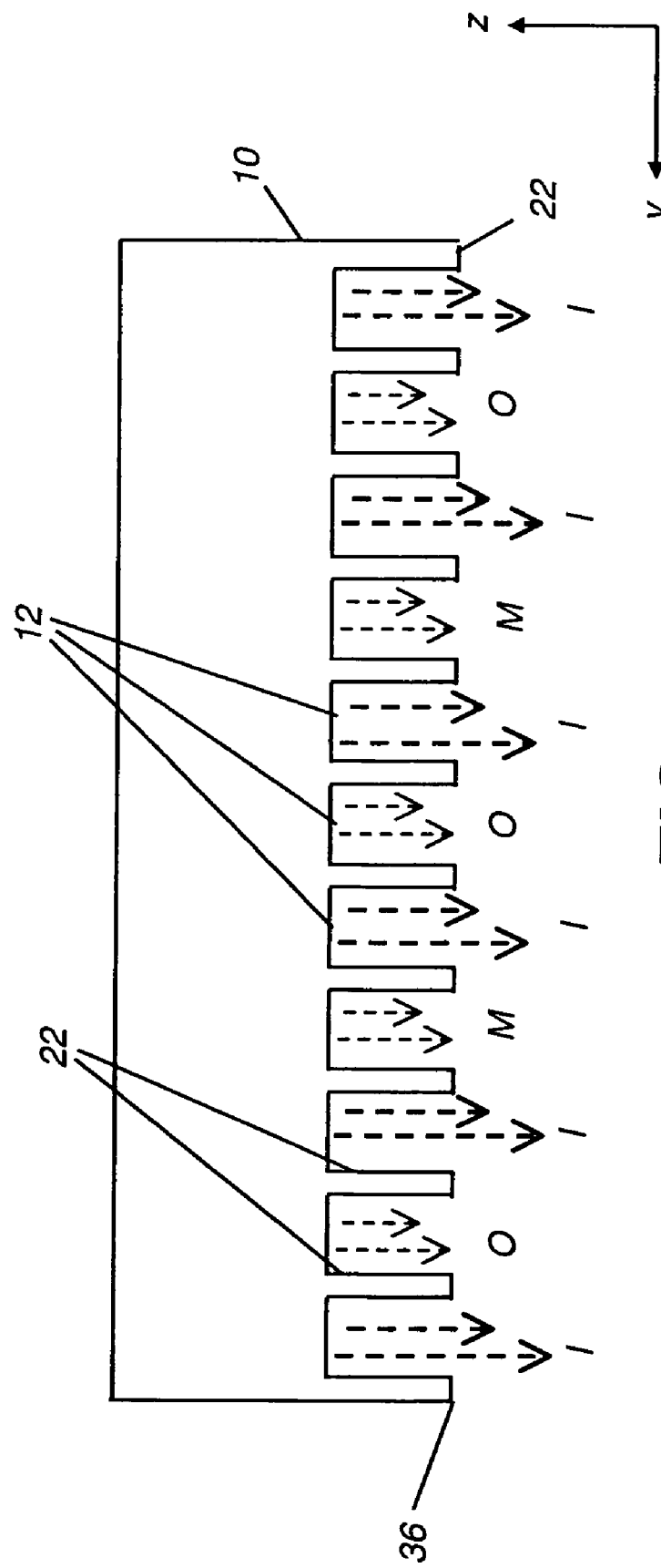
FIG. 2 is a cross-sectional side view of one embodiment of a distribution manifold showing one exemplary arrangement of gaseous materials provided to a substrate that is subject to thin film deposition.

The cross-sectional view of FIG. 2 shows gas flows emitted over a portion of front face 36 of distribution manifold 10. In this particular arrangement, each output channel 12 is in gaseous flow communication with one of gas inlet ports 14, 16 or 18 seen in FIG. 1. Each output channel 12 delivers typically a first reactant gaseous material O, or a second reactant gaseous material M, or a third inert gaseous material I.

FIG. 2 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The critical requirement is that an inter-stream labeled I must separate any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 2 and following suggests some typical types of reactant gases. For example, first reactant gaseous material O could be an oxidizing gaseous material; second reactant gaseous material M would be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

The cross-sectional views of FIGS. 3A and 3B show, in simplified schematic form, the ALD coating operation performed as substrate 20 passes along output face 36 of distribution manifold 10 when delivering reactant gaseous materials O and M. In FIG. 3A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 3A and 3B show, inert gaseous material I is provided in every alternate output channel 12, between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend at a perpendicular to the surface of substrate 20.

Notably, there are preferably no vacuum channels interspersed between the output channels 12, that is, no vacuum channels on either side of a channel delivering gaseous materials to drawn the gaseous materials around the partitions. This advantageous, compact arrangement is possible because of the innovative gas flow that is used. Unlike gas delivery arrays of earlier systems that apply substantially vertical (that is, perpendicular) gas flows against the substrate and must then draw off spent gases in the opposite vertical direction, distribution manifold 10 directs a gas flow (preferably substantially laminar in one embodiment) along the surface for each reactant and inert gas and handles spent gases and reaction by-products in a different manner, as described subsequently. The preferably unidirectional flow used in the present invention is directed along and generally parallel to the plane of the substrate surface. In other words, the flow of gases is substantially transverse to the plane of a substrate rather than perpendicular to the substrate being treated.

The present apparatus and system can be used in processes described in more detail in commonly assigned, concurrently filed U.S. Publication Number 2008/08997, by Levy et al. and entitled, "PROCESS FOR ATOMIC LAYER DEPOSITION, hereby incorporated by reference.

Figure 4:
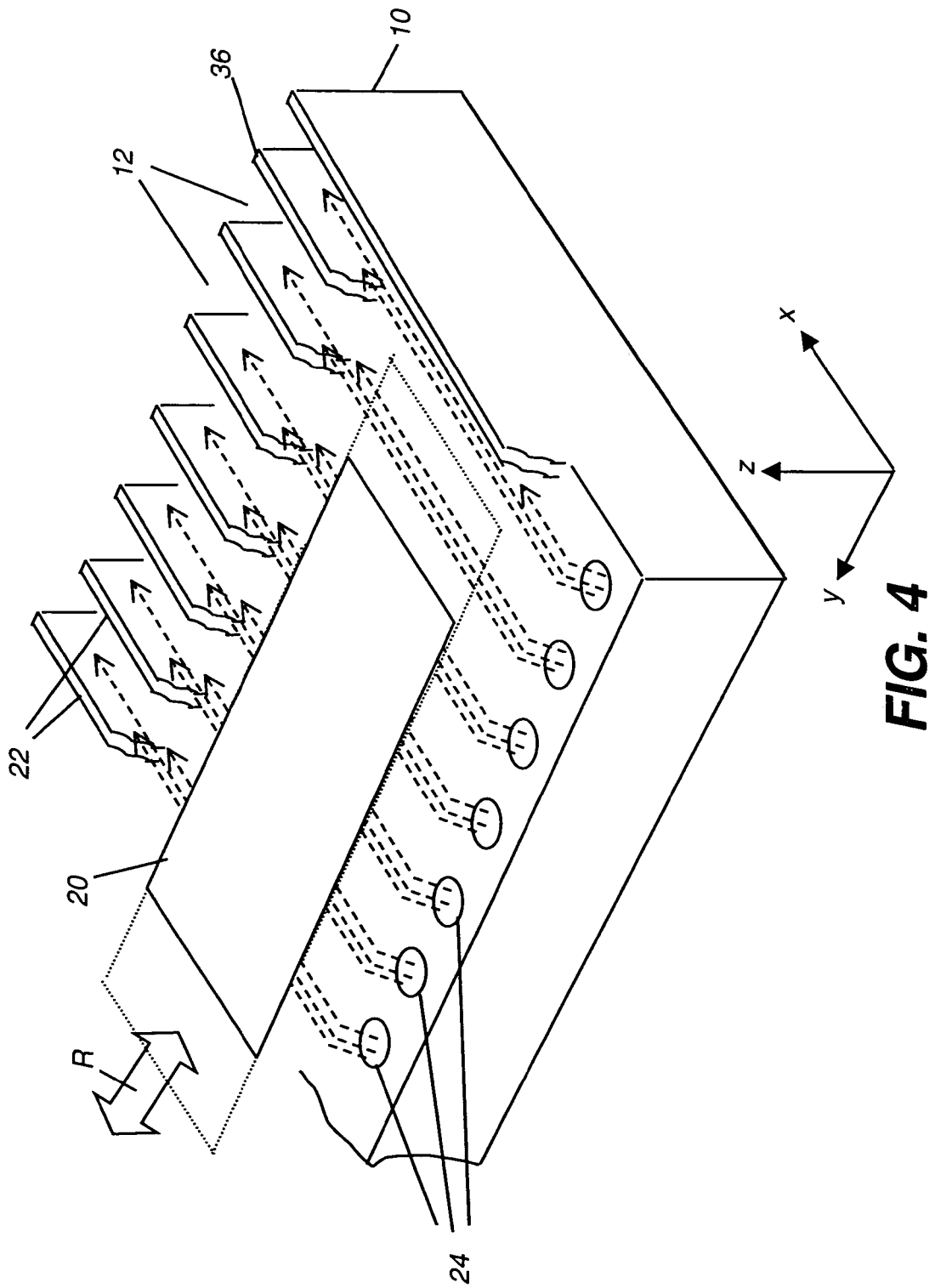
FIG. 4 is a perspective view, from the output face side, of a portion of one embodiment of a distribution manifold, showing the orientation of output channels relative to the substrate and reciprocating motion, during deposition on the substrate.
Figure 5:
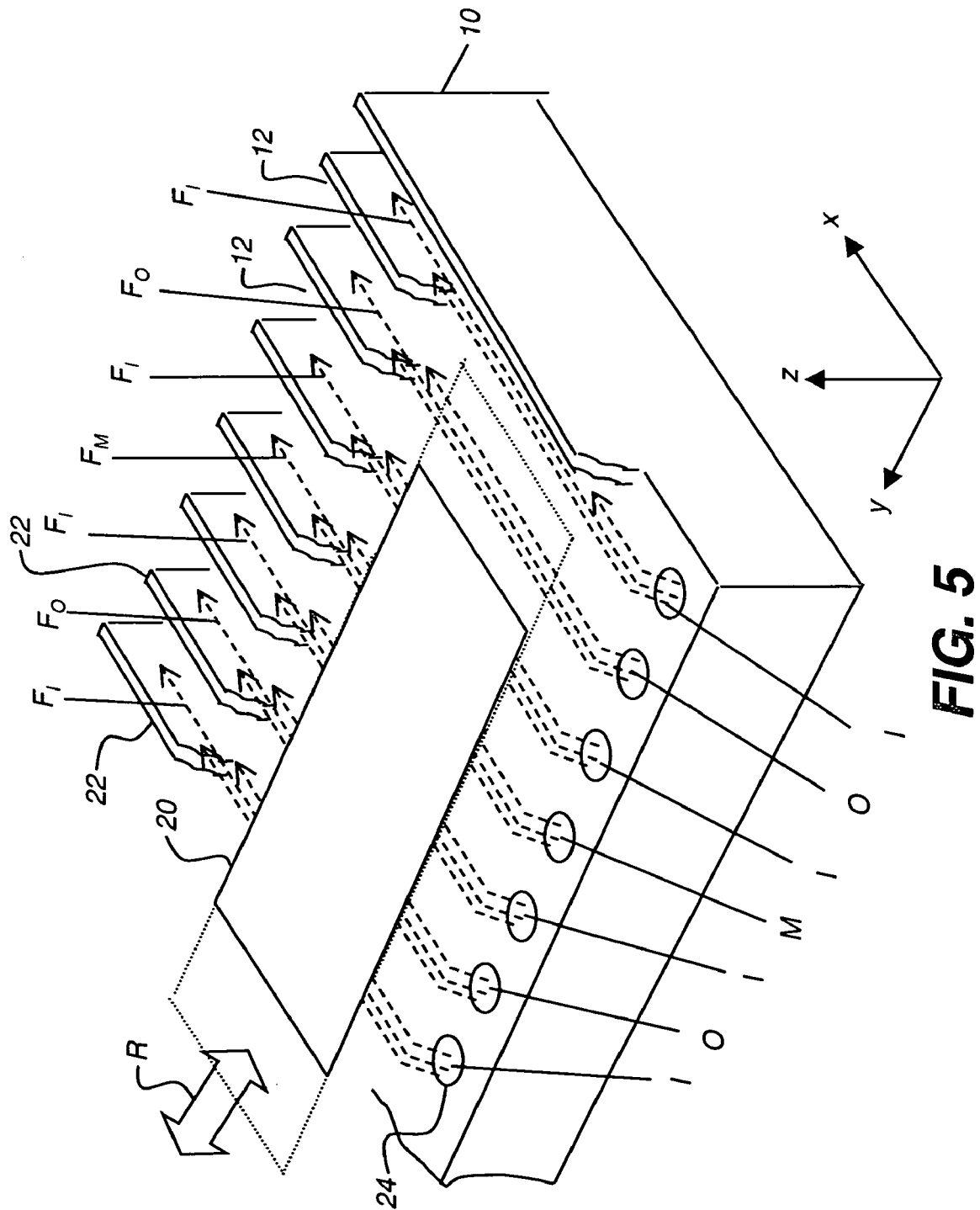
FIG. 5 is a perspective view as in FIG. 4, showing one exemplary arrangement of gas flow.

FIGS. 4 and 5 show perspective views of one embodiment of distribution manifold 10 from the output face 36 (that is, from the underside with respect to FIGS. 1-3B). Partitions 22 that define and separate the adjacent output channels 12 are represented as partially cut away, to allow better visibility for the gas flows flowing from gas outlet ports 24. FIGS. 4 and 5 also show reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 5 shows the flows $F_I$, $F_O$, and $F_M$ for the various gaseous materials delivered from distribution manifold 10 with this embodiment. Flows $F_I$, $F_O$, and $F_M$ are in the x-direction, that is, along the length of elongated output channels 12.

The cross-sectional views of FIGS. 6A, 6B, 6C, and 6D are taken orthogonally to the cross-sections of FIGS. 1-3B and show preferably gas flows in one direction from this view. Within each output channel 12, the corresponding gaseous material flows from a gas output port 24, shown in phantom in the views of FIGS. 6A, 6B, 6C, and 6D. In the embodiment of FIG. 6A, a flow F1 directs the gaseous material along the length of output channel 12 and across substrate 20, as was described with reference to FIGS. 4 and 5. Flow F1 continues past the edge of distribution manifold 10 in this arrangement, flowing outward into the environment or, if desirable, to a gas collection manifold (not shown). FIG. 6B shows an alternative embodiment for a flow F2 in which output channel 12 also provides an exhaust port 26 for redirection or drawing off of the gas flow. FIG. 6C shows an alternative embodiment for a flow F3, in which gas output port 24 is centrally located within output channel 12 and directs gaseous material to flow along the channel in both directions. FIG. 6D shows an alternate embodiment for flow F4, in which gas output port 24 is also centrally positioned, with multiple exhaust ports 26 suitably placed near the extreme ends of output channel 12. Although unidirectional flows are preferred, some degree of mixing can occur and even may be beneficial to some extent, depending on the flow rates and other circumstances involved in a particular application.

A particular distribution manifold 10 may use output channels 12 configured using any one of the flow configurations or combinations thereof, either the F1 flow of FIG. 6A, the F2 flow of FIG. 6B, the F3 flow of FIG. 6C, the F4 flow of FIG. 6D, or some other variation in which gaseous material is directed to flow across substrate 20 along output channel 12, preferably in a substantially laminar fashion. In one embodiment, one or more exhaust ports 26 are provided for each output channel 12 that delivers a reactant gaseous material. For example, referring to FIG. 5, output channels 12 for first and second reactant gaseous materials, labeled O and M, are configured with exhaust ports 26 to vent or draw off the reactant substances, following the pattern of flow F2 (FIG. 6B). This allows some recycle of materials and prevents undesirable mixing and reaction near the end of the manifold. Output channels 12 for inert gaseous material, labeled I, do not use exhaust ports 26 and thus follow the pattern of flow F1 (FIG. 6A).

Exhaust port 26 is not a vacuum port, in the conventional sense, but is simply provided to draw off the flow in its corresponding output channel 12, thus facilitating a uniform flow pattern within the channel. A negative draw, just slightly less than the opposite of the gas pressure at gas output port 24, can help to facilitate an orderly flow. The negative draw can, for example, operate at a pressure of between 0.9 and 1.0 atmosphere, whereas a typical vacuum is, for example, below 0.1 atmosphere. An optional baffle 58, as shown in dotted outline in FIGS. 6B and 6D, may be provided to redirect the flow pattern into exhaust port 26.

Use of a flow pattern such as F1 or F3, or its variants F2 and F4 with exhaust port 26, provides a number of advantages over conventional approaches, such as those noted earlier in the background section, that use an array of continuous gas sources directed orthogonally against the surface. Because separate vacuum channels are not needed, distribution manifold 10 can be very compact, directing a gaseous material along each adjacent output channel. Flow dynamics are also improved over earlier approaches, since the flow that is used is less likely to encounter barrier layer effects. Inert gas flow $F_I$ provides a type of "sweep purge" that removes excess material from the previous output channel 12 as well as unwanted reaction by-products. Inert gas flow $F_I$ also helps to separate the reactant gases of flows $F_O$ and $F_M$, so that mixing of these reactant gases above the surface of substrate 20 is minimized or eliminated. Because conventional vacuum is not used, the design of distribution manifold 10 is less complex than gas array designs that require a vacuum pump channel between each gas delivery channel, with vacuum levels carefully calibrated to balance against output flows.

The flow arrangement used in the present invention depends on the distance D, shown in FIG. 1, between substrate 20 and output face 36 of distribution manifold 10. Because no gas flow around partition 22 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the distribution manifold 10 closer to the substrate surface is preferred in the present invention. In a preferred embodiment, distance D from the surface of the substrate can be 0.4 mm or less, preferably within 0.3 mm, more preferably within 0.25 mm of the output face of the distribution manifold.

The cross-sectional views of FIGS. 7A and 7B show why it is desirable that the distance D is relatively small, consistent with the operation of the invention. In these figures, distribution manifold 10 is moving over substrate 20 from left to right, as the arrow indicates. As output channel 12 carrying a reactive gaseous material M moves to the right over an area, it encounters a diffusion layer 72 from the next adjacent (previous-in-time) output channel that is primarily inert gaseous material I. In order to react on the surface of substrate 20, reactive gaseous material M must diffuse through diffusion layer 72, which has a thickness proportional to distance D. By comparison, FIG. 7B shows what happens when distance D is reduced: diffusion layer 72 is reduced proportionately. Diffusion through diffusion layer 72 happens more quickly and more efficiently, allowing less waste and reducing the overall amount of time needed for reaction on the surface of substrate 20. The lower partition walls 22 also prevent less gas to remain from the previous-in time output channel gas. It should be noted that the flow of the gases in the channels are perpendicular to the page of the FIGS. 7A and 7B, as shown by the back of the arrow, which flow maintains a concentration gradient that aids the diffusion through the thin diffusion layer 72 to the surface of the substrate. The surface is exposed to the gas flow of M for sufficient time for diffusion and any mixing to replace the previous-in-time output channel gas. It is noted that since the flow of gas is across the surface rather than directly into the surface it limits the undesirable mixing of reactant gases between outlet channels, which might otherwise be exacerbated by relative oscillation of the manifold and/or substrate.

In order to provide a smooth flow along the length of output channel 12, gas output port 24 may be inclined at an angle away from normal, as indicated in FIGS. 6A and 6B. Optionally, some type of gas flow redirecting structure may also be employed to redirect a downward flow from gas output port 24 so that it forms a flow that runs substantially in parallel to output face 36.

The plan view of FIG. 8 shows output face 36 of a portion of distribution manifold 10 in one embodiment. For optimizing directional flow, redirecting plates 38 are positioned in each of the output channels 12 for directing reactant gaseous materials. In the embodiment shown, only output channels 12 that deliver reactant gaseous materials are provided with redirecting plates 38 and exhaust ports 26. This particular arrangement may be advantageous in some applications, where it is advantageous to surround distribution manifold 10 with inert gas, such as to reduce unwanted intake of ambient gases. However, redirecting plates 38 could be used on all output channels 12. Also, exhaust ports 26 could be used on some or all output channels 12. In another possible embodiment, redirecting plates can be used on all channels, but the outlet edge of the redirecting plate may be at a different x-axis position depending upon which channel is considered. In particular, it may be desirable to have the outlet edge position of the baffles for the inert flows to be at lower x-axis positions than those of the reactant gases so that the inert purge flows can serve as mentioned above to isolate the various channels.

FIG. 8 also shows the pattern of output channels in one embodiment. Here, it has been found to be particularly advantageous to provide inert gas channels I as the outermost channels of distribution manifold 10. Oxidation channels with first reactant gaseous material O are next to the outermost channels, since these condition the surface for ALD reaction with the metallic component of second reactant gaseous material M.

Figure 9:
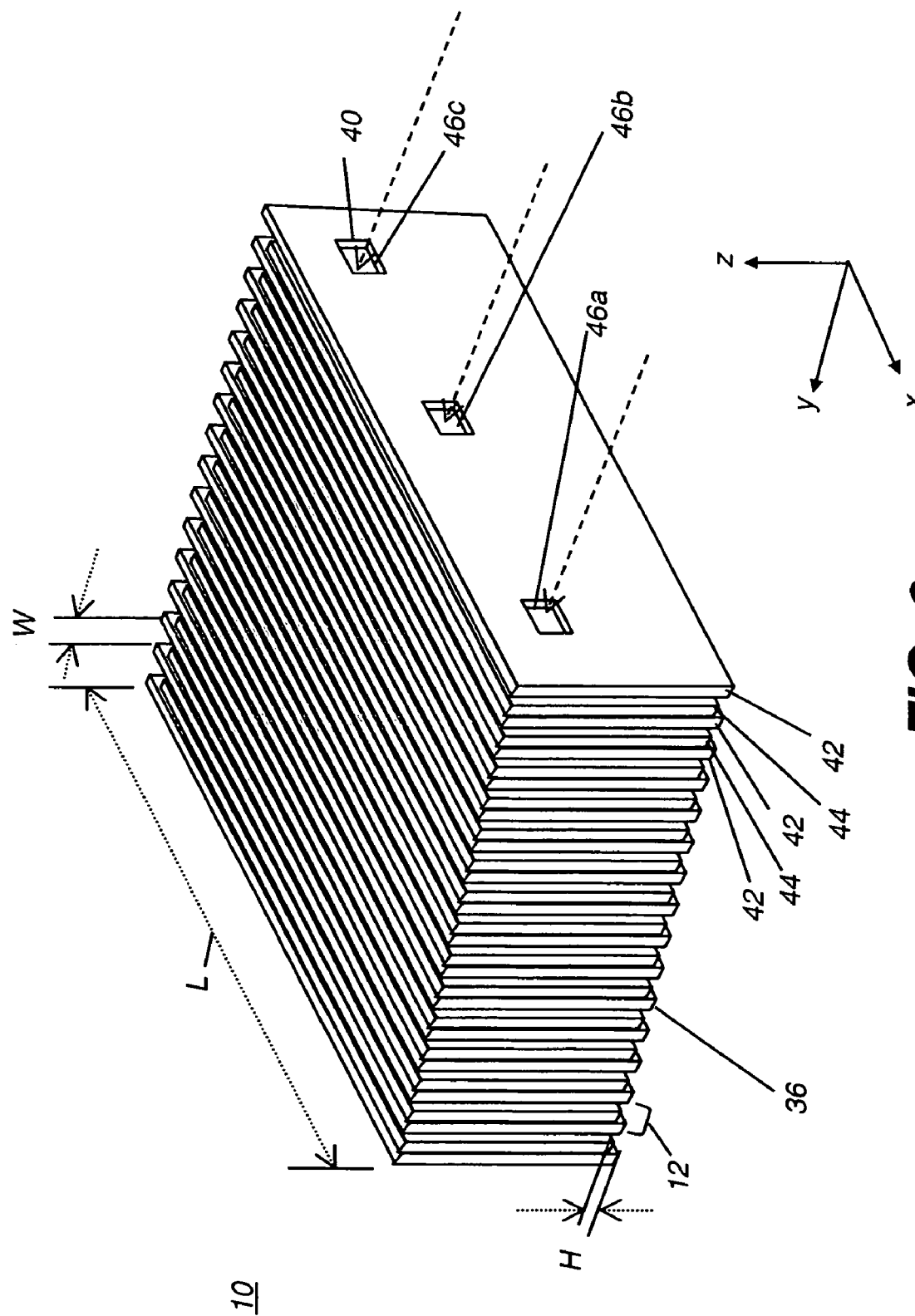
FIG. 9 is a perspective view of one embodiment of a distribution manifold formed from stacked plates in one embodiment.
Figure 10A:
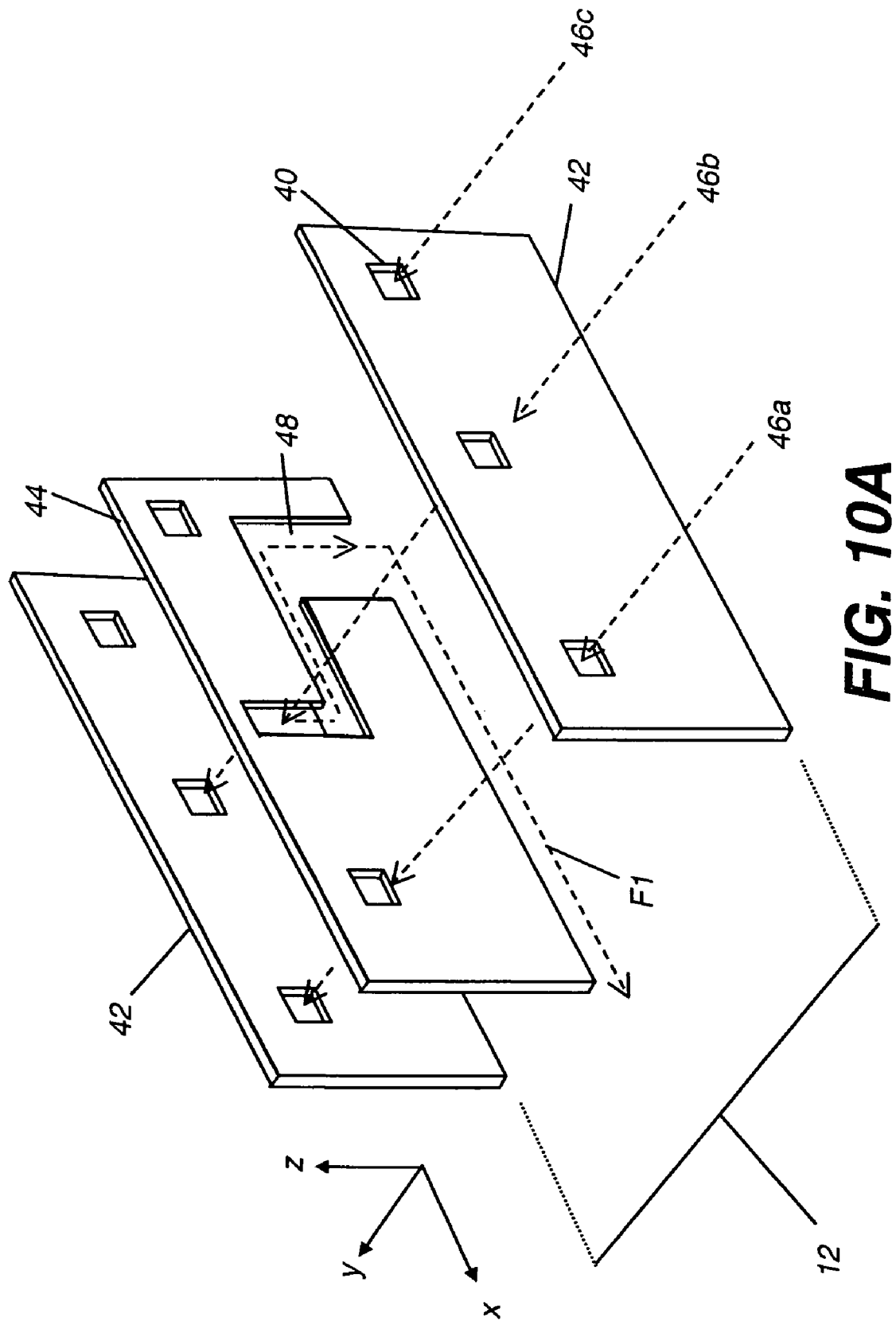
FIGS. 10A and 10B are exploded views of one embodiment of the construction of a distribution manifold that employs the stacked-plate structure shown in FIG. 9, the exploded views showing two different output channels for different gases used in the process.
Figure 10B:
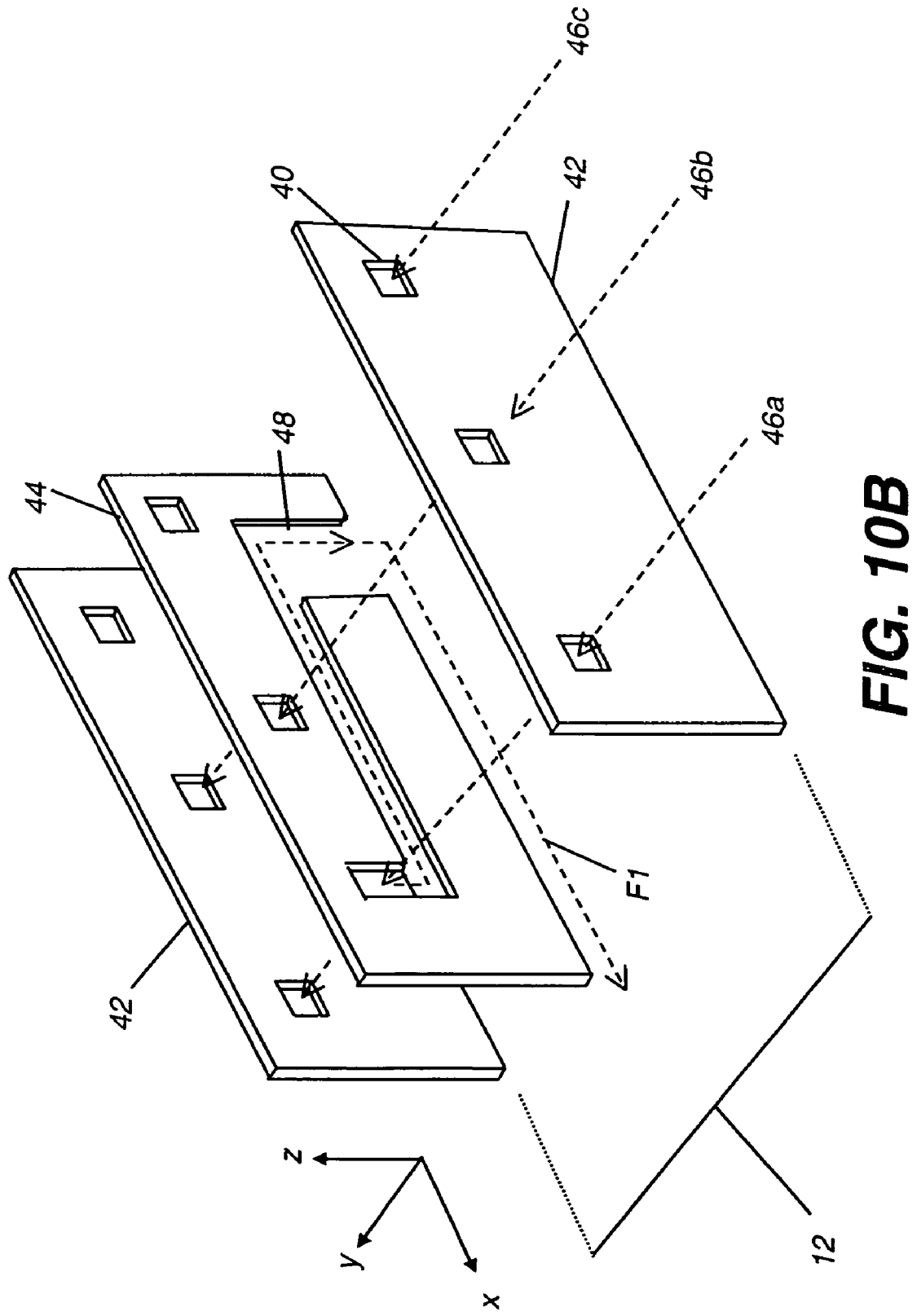

FIG. 9 shows one embodiment of a distribution manifold 10 in which the channels of width W, length L, and height H are formed from stacked metal plates 42 and 44 having apertures 40 forming ducts 46a,b,c. FIG. 10A shows an exploded view of a single output channel 12 section of distribution manifold 10 formed in this way, showing an arrangement of apertures 40 in alternating partition plates 42 and delivery plates 44. FIG. 10B shows a similar exploded view for an adjacent output channel 12. Ducts 46a, 46b, and 46c, formed by alignment of apertures 40, extend through distribution manifold 10 and provide input conduits for gaseous flow communication, accepting the different reactant and inert gaseous materials from external sources and providing the redirecting structures that provide gas flows along output face 36 described earlier. Baffles and other redirecting structures are not shown in these figures, but could be provided using stacked plates suitably structured, or applied after the device is assembled.

The exploded views of FIGS. 10A and 10B each show a single output channel 12 formed from stacked plates 42 and 44. In the example of FIG. 10A, output channel 12 shown provides gaseous material provided from duct 46b. Ducts 46a and 46c conduct other gases past this channel in the embodiment shown in FIG. 10A. Delivery plate 44, dimensioned and apertured differently than the partition plates 42 that bound output channel 12 acting as a shim and a spacer element as well as guiding the flow of gaseous material, contains a redirecting chamber 48 that redirects a portion of the gas in duct 46b into gas flow F1. In the example of FIG. 10B, output channel 12 shown provides gaseous material provided from duct 46a. Ducts 46b and 46c conduct other gases past this channel in the embodiment shown in FIG. 10B. Plates 42 and 44 should be of a suitable metal for conducting the reactive gaseous materials, such as stainless steel or other metal for example.

It is desirable that when a large number of plates are assembled for such an embodiment, the gas flow delivered to the substrate is uniform across all of the channels delivering a particle flow (I, M, or O). This can be accomplished by proper design of the plates, such as having restrictions in some part of the flow pattern for each plate which are accurately machined to provide a reproducible pressure drop for each channel.

Although the method of stacking plates is a particularly useful way of constructing the article of this invention, there are a number of other methods to build such structures and may be useful in alternate embodiments. For example, the apparatus may be constructed by direct machining of a metal block, or of several metal blocks adhered together. Furthermore, molding techniques involving internal mold features can be employed, as will be understood by the skilled artisan. The apparatus can also be constructed using any of a number of stereolithography techniques.

As can be seen from the example embodiment of FIGS. 9, 10A, and 10B, distribution manifold 10 can be constructed of very small size, with each output channel 12 having the width of a sheet of metal plating. For example, in one embodiment using the arrangement of FIGS. 9, 10A, and 10B, output channel 12 is about 0.034 inches (0.86 mm) in width W. In one embodiment, the width of the opening of at least one elongated output channel, preferably all, is between about 0.2 to 5 mm, more preferably 0.50 and 1.50 mm. Output channels 12 for different materials could be fabricated at different thicknesses to obtain width W ranges, preferably from about 0.01 inches (0.25 mm) to about 0.1 inches (2.5 mm) for a compact arrangement. The length L of output channel 12 can vary, depending on the needed uniformity and desired gas pressure. In one embodiment, output channel length L is about 3 inches (75 mm). The height H of output channels 12 formed from extending portions of stacked plates 42 is about 0.1 inches (2.5 mm) in one embodiment.

Figure 11:
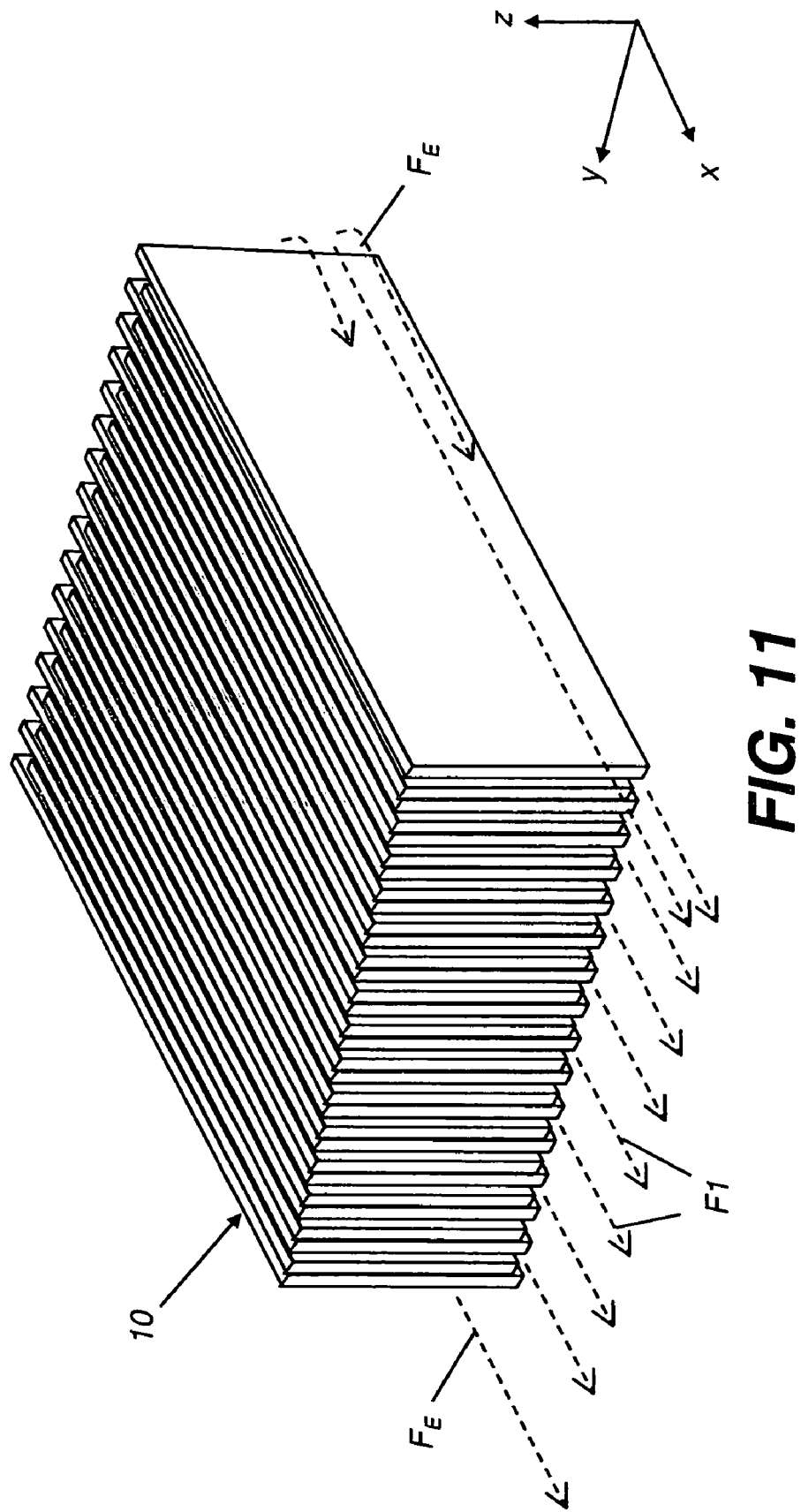
FIG. 11 is a perspective view showing an embodiment using an enveloping shroud of inert gas directed along the perimeter of the distribution manifold.

Because gas flow can inadvertently draw ambient gases, due to low-pressure zones that are created, it may be useful to provide additional protection barrier from an inert layer. Referring to FIG. 11, there is shown an envelopment gas flow $F_E$ by which an additional flow of inert gas is used on one or more sides of distribution manifold 10 to prevent ambient gases from contaminating the process gases.

As was particularly described with reference to FIGS. 3A and 3B, distribution manifold 10 requires movement relative to the surface of substrate 20 in order to perform its deposition function. This relative movement can be obtained in a number of ways, including movement of either or both distribution manifold 10 and substrate 20, such as by movement of an apparatus that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example distribution manifold 10 of FIG. 8, having a nominal channel width of 0.034 inches in width W for each output channel 12, reciprocating motion (along the y axis as used herein) of at least 0.204 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

A distribution manifold 10 may have only enough output channels 12 to provide a single cycle. Alternately, distribution manifold 10 may have an arrangement of multiple cycles, enabling it to cover a larger deposition area or enabling its reciprocating motion over a distance that allows two or more deposition cycles in one traversal of the reciprocating motion distance.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 12:
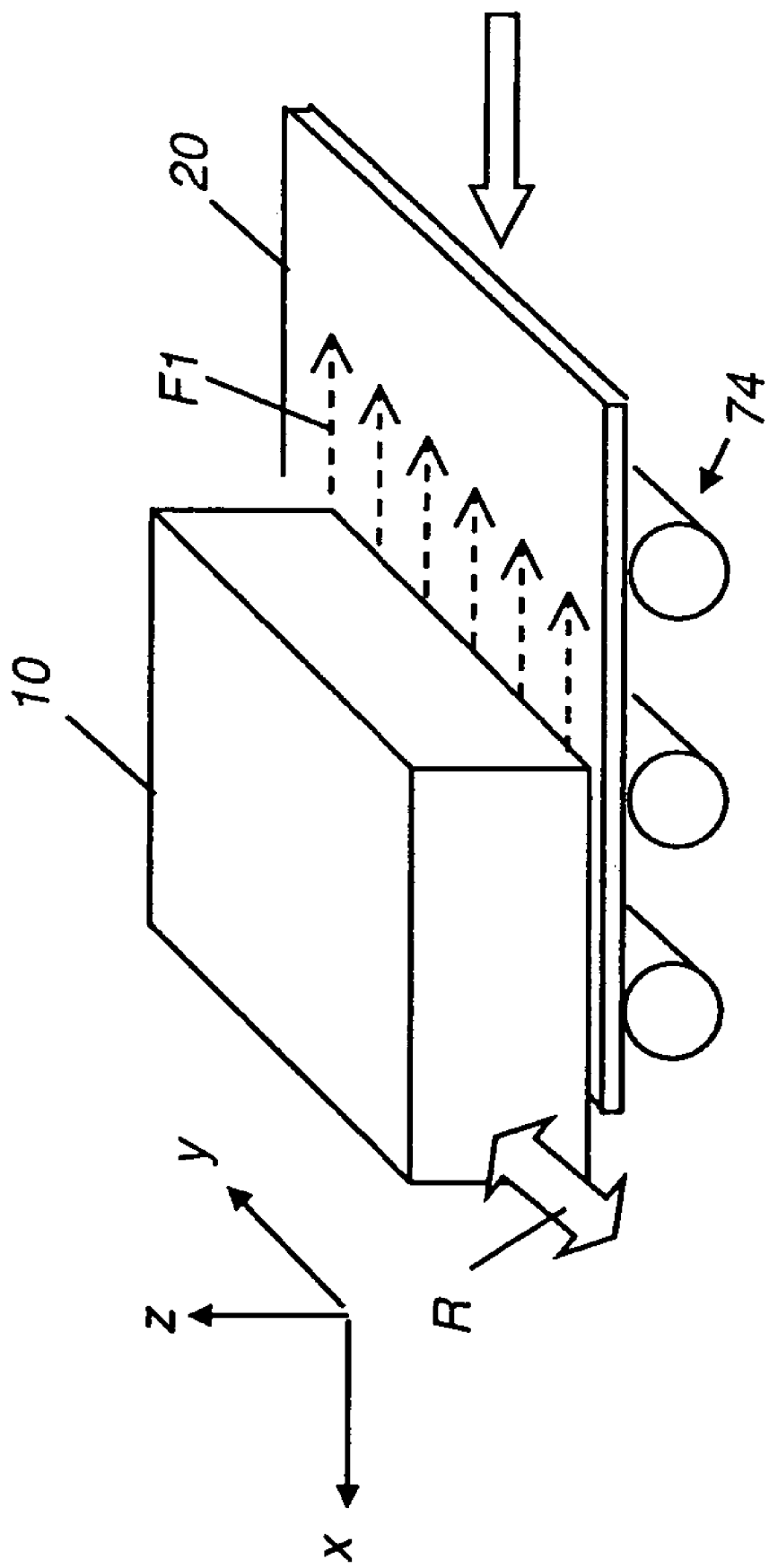
FIG. 12 is a schematic diagram showing an alternative motion pattern for reciprocating and orthogonal movement.

An advantage of the reciprocating motion used for a distribution manifold 10 of the present invention is that it allows deposition onto a substrate 20 whose area exceeds the area of output face 36. FIG. 12 shows schematically how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 12, can be effected either by movement of distribution manifold 10, or by movement of substrate 20 provided with a substrate support 74 that provides movement, or by movement of both distribution manifold 10 and substrate 20.

In FIG. 12 the relative motion of the distribution manifold and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the distribution manifold over a fixed substrate; an oscillation combined with displacement of the substrate relative to a fixed substrate distribution manifold; or any combinations wherein the oscillation and fixed motion are provided by movements of both the distribution manifold and the substrate.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the apparatus of the present invention.

Figure 13:
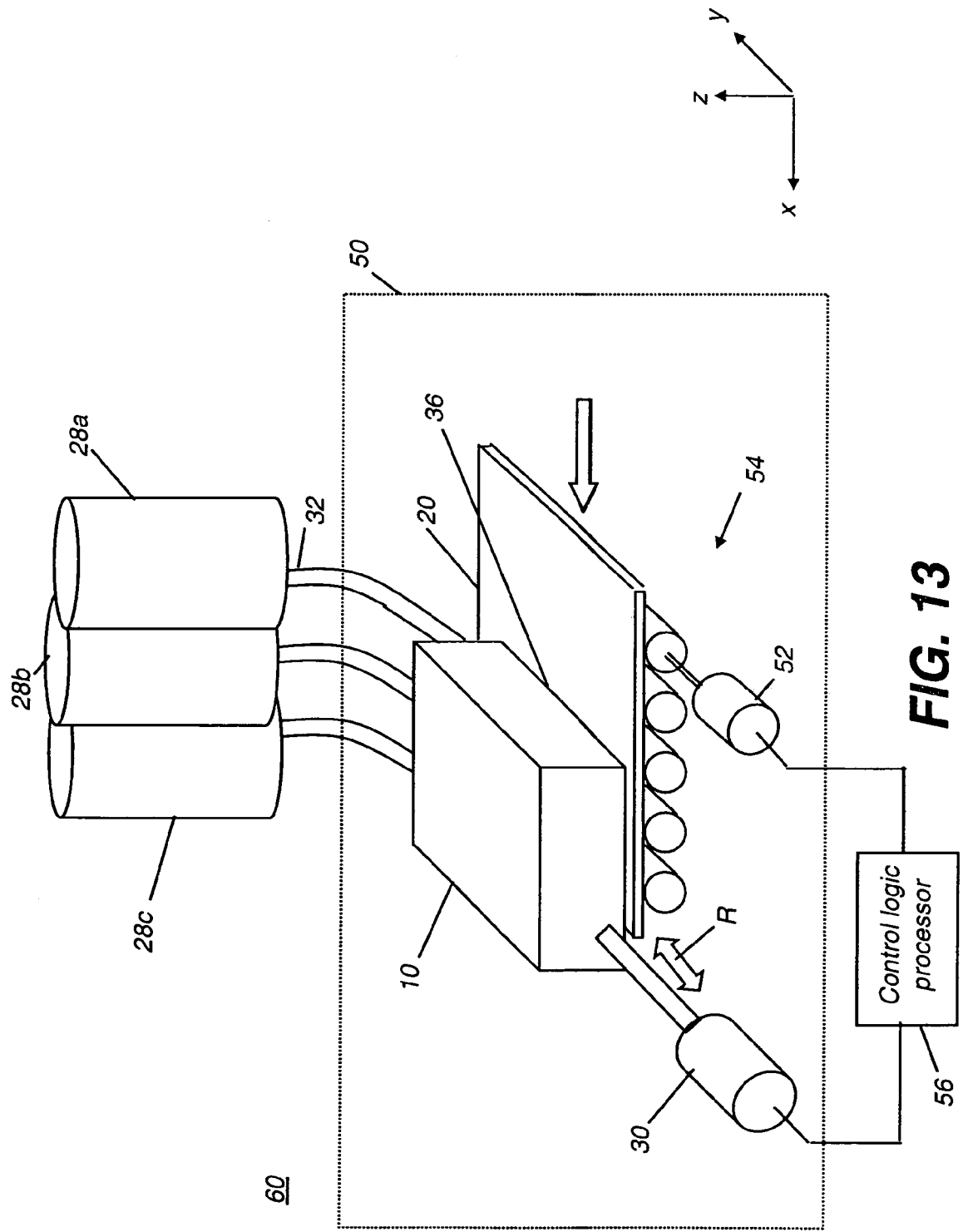
FIG. 13 is a block diagram of one embodiment of a deposition system using a distribution manifold according to the present invention.

FIG. 13 shows an Atomic Layer Deposition (ALD) system 60 having a chamber 50 for providing a relatively well-controlled and contaminant-free environment. Gas supplies 28a, 28b, and 28c provide the first, second, and third gaseous materials to distribution manifold 10 through supply lines 32. The optional use of flexible supply lines 32 facilitates ease of movement of distribution manifold 10. For simplicity, optional vacuum vapor recovery apparatus and other support components are not shown in FIG. 12 but could also be used. A transport subsystem 54 provides a substrate support that conveys substrate 20 along output face 36 of distribution manifold 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 13, control logic processor 56 controls an actuator 30 for providing reciprocating motion to distribution manifold 10 and also controls a transport motor 52 of transport subsystem 54.

Figure 14:
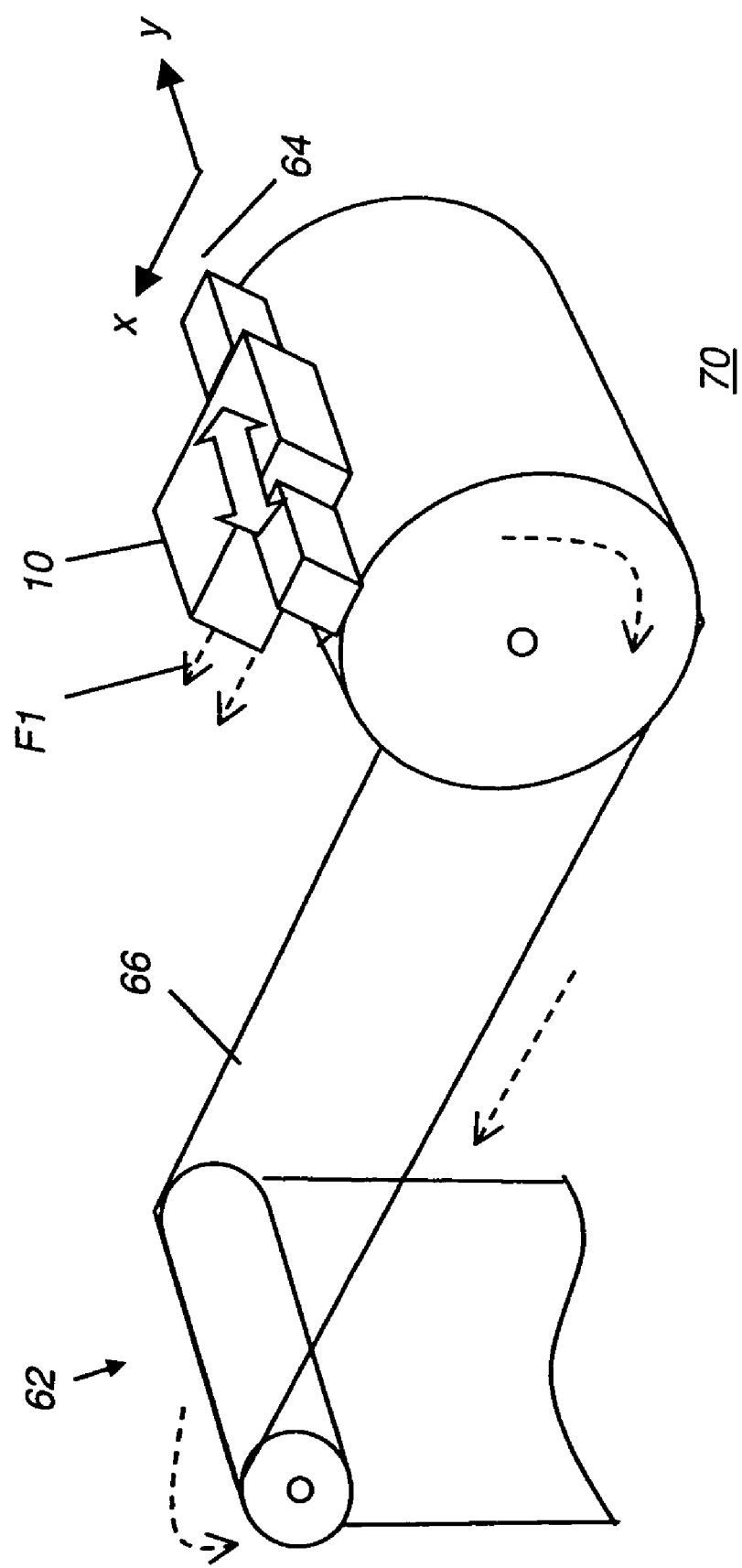
FIG. 14 is a block diagram showing one embodiment of a deposition system applied to a moving web.

FIG. 14 shows an alternate embodiment of an Atomic Layer Deposition (ALD) system 70 for thin film deposition onto a web substrate 66 that is conveyed past distribution manifold 10 along a web conveyor 62 that acts as a substrate support. A distribution manifold transport 64 conveys distribution manifold 10 across the surface of web substrate 66 in a direction transverse to the web travel direction. In one embodiment, distribution manifold transport 64 uses a lead screw that traverses the width of web substrate 66. In another embodiment, multiple distribution manifolds 10 are used, at suitable positions along web 62.

Figure 15:
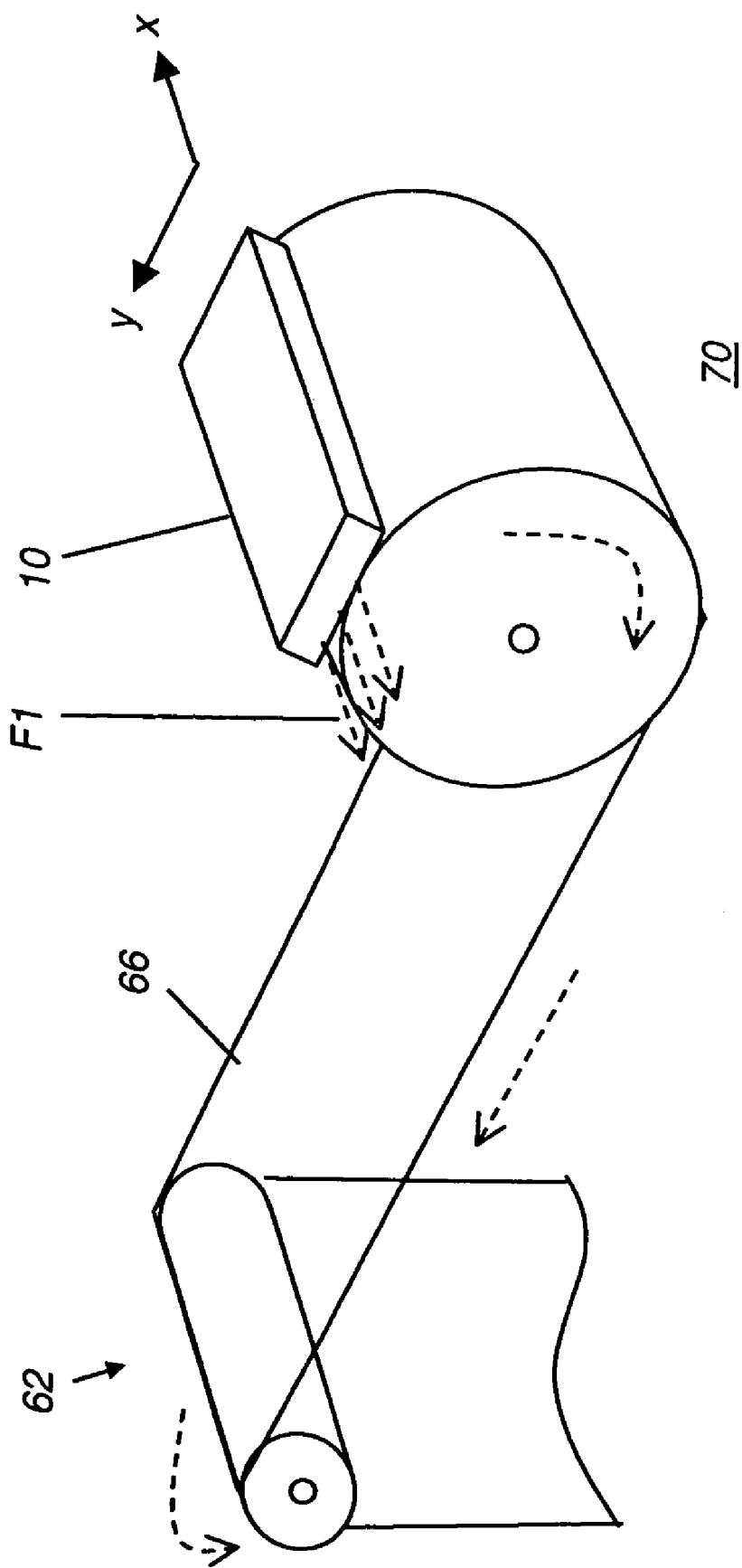
FIG. 15 is a block diagram showing another embodiment of deposition system applied to a moving web, with the distribution manifold stationary.
Figure 16:
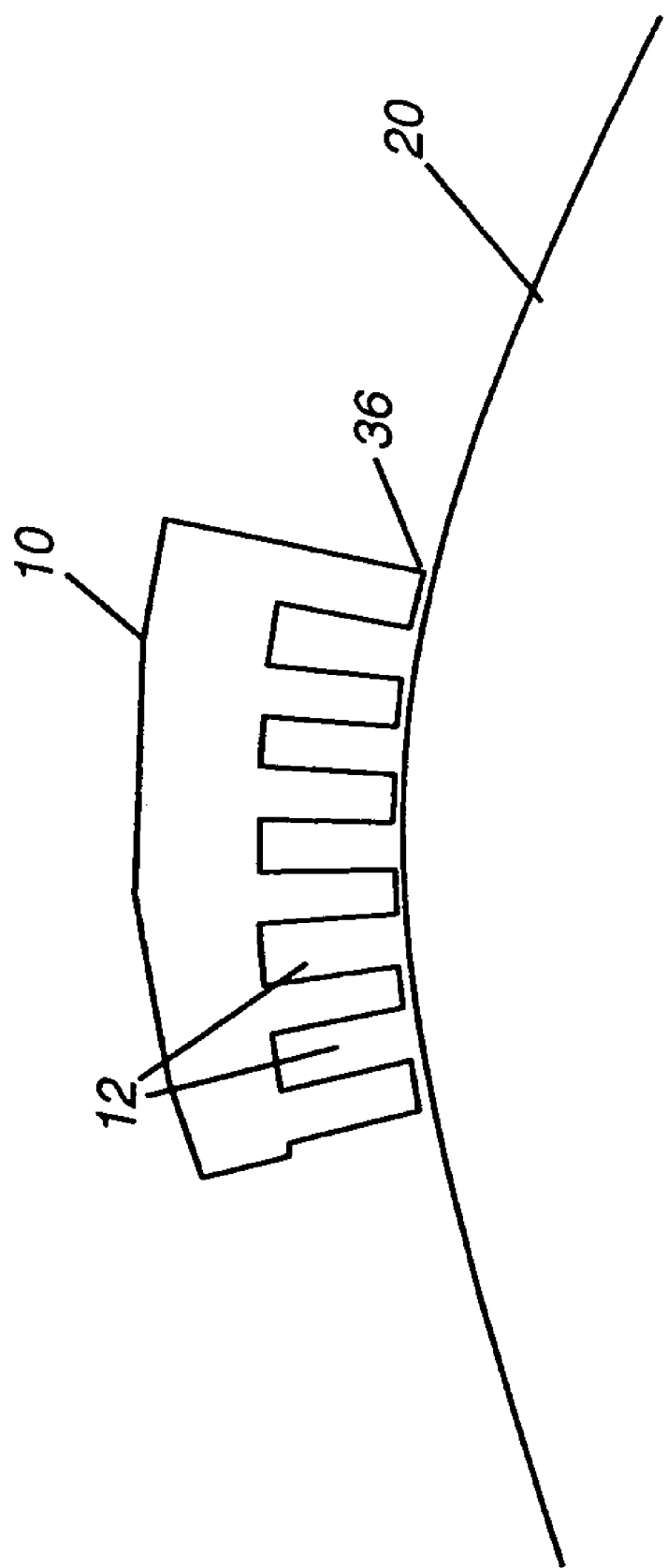
FIG. 16 is a cross-sectional side view of one embodiment of a distribution manifold with an output face having curvature.

FIG. 15 shows another Atomic Layer Deposition (ALD) system 70 in a web arrangement, using a stationary distribution manifold 10 in which the flow patterns are oriented orthogonally to the configuration of FIG. 13. In this arrangement, motion of web conveyor 62 itself provides the movement needed for ALD deposition. Reciprocating motion could also be used in this environment, such as by repeatedly reversing the direction of rotation of a web roller to move substrate 66 forward and backwards relative to distribution manifold 10. Reciprocation motion can also be obtained by allowing a reciprocating motion of the distribution manifold across an arc whose axis coincides with the roller axis, while the web is moved in a constant motion. Referring to FIG. 16, an embodiment of a portion of distribution manifold 10 is shown in which output face 36 has an amount of curvature, which might be advantageous for some web coating applications. Convex or concave curvature could be provided.

The apparatus of the present invention is advantaged in its capability to perform deposition onto a substrate over a broad range of temperatures, including room or near-room temperature in some embodiments. The apparatus of the present invention can operate in a vacuum environment, but is particularly well suited for operation at or near atmospheric pressure.

EXAMPLES

Figure 17:
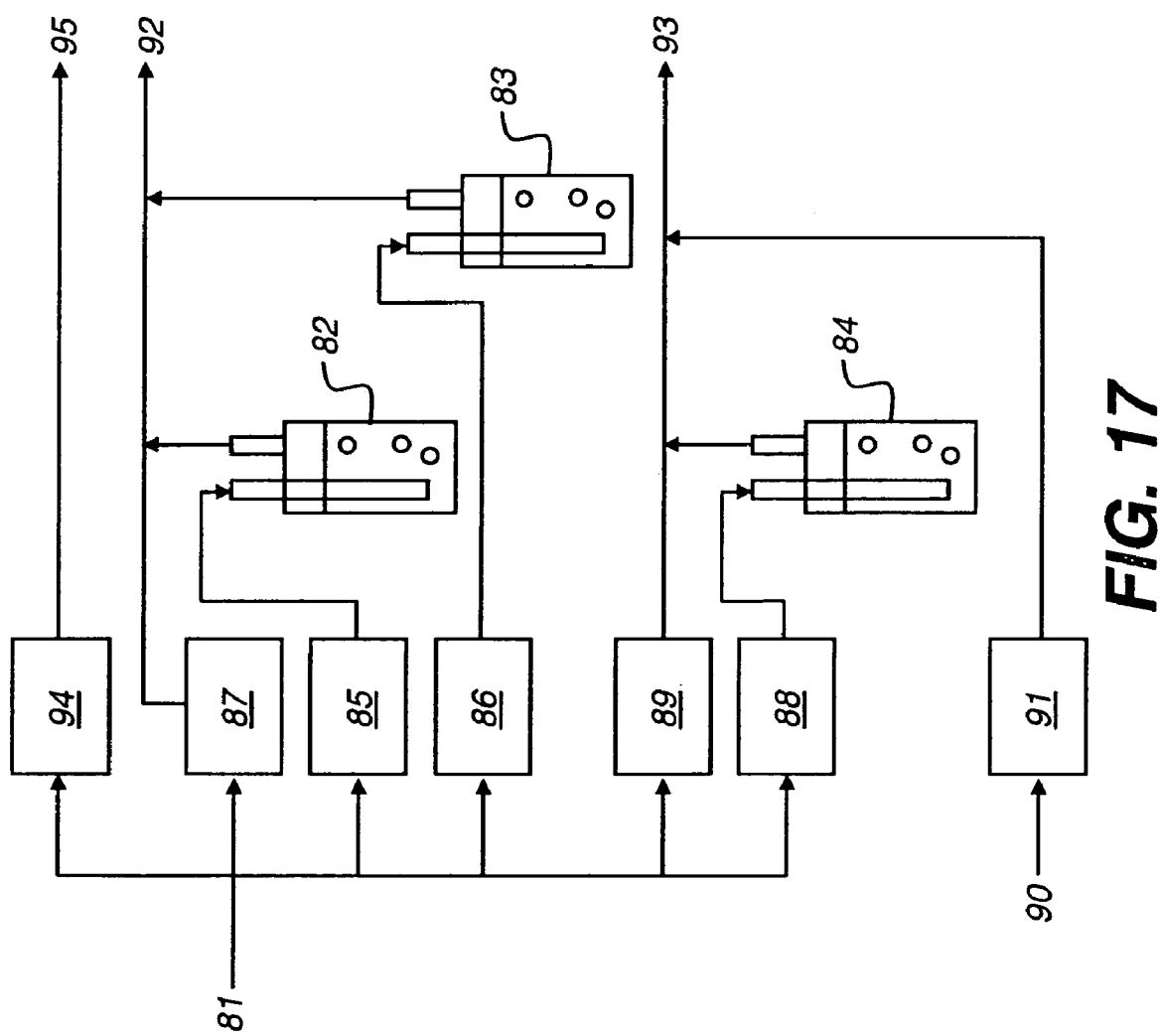
FIG. 17 is a block diagram of the source materials for a thin film deposition according to the Examples.

All of the following thin film examples employ a flow setup as indicated in FIG. 17. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal precursor flow 92 containing metal precursors diluted in nitrogen gas; oxidizer-containing flow 93 containing non-metal precursors or oxidizers diluted in nitrogen gas; nitrogen purge flow 95 composed only of the inert gas. The composition and flows of these streams are controlled as described below.

Gas bubbler 82 contains a 1 molar solution of diethylzinc in hexanes. Gas bubbler 83 contains a 2 molar solution of trimethylaluminum in hexanes. Both bubblers are kept at room temperature. Flow meters 85 and 86 deliver flows of pure nitrogen to the diethylzinc bubbler 82 and trimethylaluminum bubbler 83, respectively. The output of the bubblers now contain nitrogen gas saturated with the respective precursor solutions. These output flows are mixed with a nitrogen gas dilution flow delivered from flow meter 87 to yield the overall flow of metal precursor flow 92. In the following examples, the flows will be as follows:

Flow meter 85: To Diethylzinc Bubbler Flow
Flow meter 86: To Trimethylaluminum Bubbler Flow
Flow meter 87: To Metal Precursor Dilution Flow Gas bubbler 84 contains pure water at room temperature. Flow meter 88 delivers a flow of pure nitrogen gas to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water composition, oxygen composition, and total flow. In the following examples, the flows will be as follows:

Flow meter 88: To Water Bubbler
Flow meter 89: To Oxidizer Dilution Flow
Flow meter 91: To Air Flow Flow meter 94 controls the flow of pure nitrogen that is to be delivered to the coating apparatus.

Figure 18:
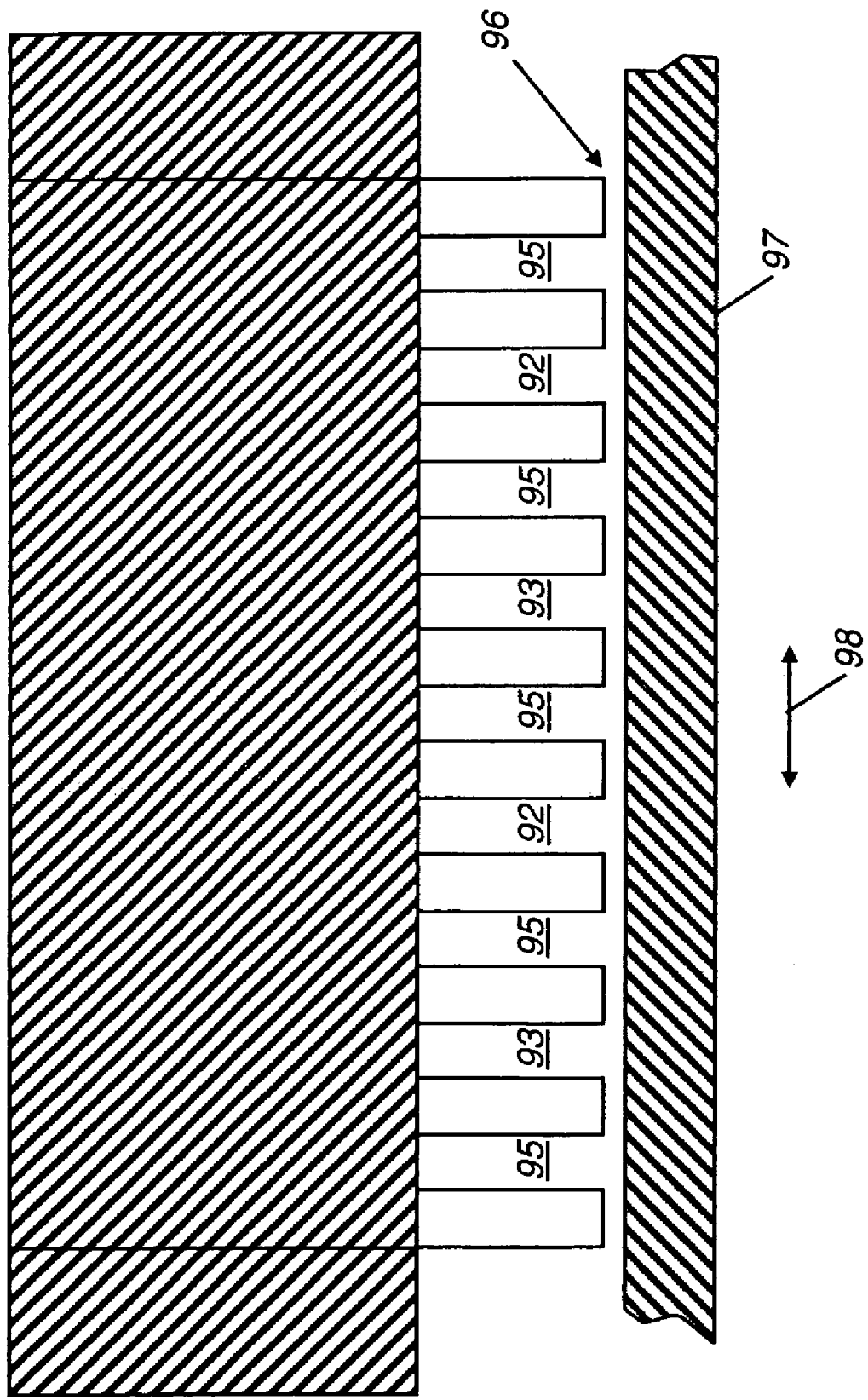
FIG. 18 is a cross-sectional side view of the distribution manifold showing the arrangement of gaseous materials provided to a substrate that is subject to thin film deposition process of the Examples.

Streams or Flows 92, 93, and 95 are then delivered to an atmospheric pressure coating head where they are directed out of the channels or microchamber slots as indicated in FIG. 18. A gap 96 of approximately 0.15 mm exists between the microchambers and the substrate 97. The microchambers are approximately 2.5 mm tall, 0.86 mm wide, and run the length of the coating head which is 76 mm. The reactant materials in this configuration are delivered to the middle of the slot and flow out of the front and back.

In order to perform a deposition, the coating head is positioned over a portion of the substrate and then moved in a reciprocating fashion over the substrate, as represented by the arrow 98. The length of the reciprocation cycle was 32 mm. The rate if motion of the reciprocation cycle is 30 mm/sec.

The following characterizations are used:

A. Transistor Measurement and Analysis

Transistor characterization of the fabricated devices fabricated using the present invention was performed with a Hewlett Packard HP 4156® parameter analyzer. Device testing was done in air in a dark enclosure.

The results were typically averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. For most devices, Vg was swept from −10 V to 40 V for each of the drain voltages measured, typically 10 V, 20 V, and 30 V. Mobility measurements were taken from the 30 V sweep.

Parameters extracted from the data include field-effect mobility ($\mu$), threshold voltage (Vth), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where W and L are the channel width and length, respectively, and $C_{ox}$ is the capacitance of the dielectric layer, which is a function of dielectric thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

The log of the drain current as a function of gate voltage was plotted. Parameters extracted from the log $I_d$ plot include the $I_{on}/I_{off}$ ratio. The $I_{on}/I_{off}$ ratio is simply the ratio of the maximum to minimum drain current.

B. Breakdown Voltage Characterization:

Breakdown voltage characterization of the fabricated devices was performed with a HEWLETT PACKARD HP 4156 parameter analyzer. Device testing was done in air in a dark enclosure.

For a dielectric layer, the breakdown voltage corresponds to the voltage placed across the layer at which a substantial current begins to flow due to dielectric breakdown.

To assess the breakdown voltage, the dielectric film in question was coated on a conductor (typically a heavily doped silicon wafer) and a metal contact was placed on top of the dielectric layer. The silicon wafer was held at ground, while the voltage applied to the top metal contact was swept from 0 to 100 V. During the sweep the current flowing into the top metal contact was measured. Although significant current leakage can occur prior to breakdown, the breakdown voltage is taken as a point at which a sharp rise in current flow can be seen.

C. Film Thickness Measurements:

Thickness of the aluminum oxide films of the following examples were measured using a J. A. WOOLAM ALPHA-SE white light ellipsometer. The data acquired were fit to a model in which the layer under examination was represented by a Cauchy dispersion model. The output of the model fitting yields the film thickness and refractive index.

The following examples demonstrate the capability of the above system to produce high performance thin film coatings of dielectrics, conductors, and semiconductors.

Example 1

This example shows the production of a zinc oxide semiconductor film according to the present invention used to produce a working thin film transistor. In this structure, the gate of the device is a heavily doped silicon wafer, and the insulator is a film of silicon dioxide grown by a thermal process on the silicon wafer prior to deposition of the zinc oxide semiconducting film.

The zinc oxide semiconductor layer was applied using the inventive deposition system. Two runs were made with the substrate temperature at 200° C. and the following conditions:

TABLE 1

| Sample | Diethylzinc Bubbler Blow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles |
| --- | --- | --- | --- | --- | --- | --- | --- |
| 1-A | 10 | 620 | 5 | 10 | 1000 | 1500 | 40 |
| 1-B | 5 | 620 | 5 | 5 | 1000 | 1500 | 40 |

After deposition of the zinc oxide, aluminum contacts were applied to the above devices by evaporation through a shadow mask to a thickness of 500 A. The shadow mask produced devices with a channel width of 500 micrometer and a channel length of 50 micrometer. All of the devices produced gave on/off ratios greater than $10^6$ and with mobilities as listed in the table below, which are an average of three devices per sample:

TABLE 2

| Sample | Mobility ($cm^2/Vs$) | Vth (volts) |
| --- | --- | --- |
| 1-A | 4.0 | 9.2 |
| 1-B | 2.9 | 8.8 |

The above data show that high mobility good quality devices employing a zinc oxide semiconductor layer can be produced with this apparatus.

Example 2

This example shows the production of aluminum oxide films according to the present invention, demonstrating the capability to make high quality insulating films with good breakdown voltage. In this structure, a bare silicon wafer is used as one electrode on which is grown a film of aluminum oxide using the inventive equipment described above.

The aluminum oxide layers were applied with the substrate at 200° C. and the following deposition conditions, where 2-B is a replicate data point.

TABLE 3

| Sample | Trimethyl-Aluminum Bubbler Blow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles |
| --- | --- | --- | --- | --- | --- | --- | --- |
| 2-A | 10 | 620 | 10 | 10 | 1100 | 1500 | 100 |
| 2-B | 10 | 620 | 10 | 10 | 1100 | 1500 | 100 |
| 2-C | 10 | 620 | 10 | 10 | 1100 | 1500 | 200 |
| 2-D | 20 | 620 | 10 | 20 | 1100 | 1500 | 100 |

After deposition of the aluminum oxide, samples were measured for thickness and refractive index using ellipsometry. After that, aluminum contact pads were applied to the top of the sample D film using shadow mask evaporation so that dielectric breakdown measurements could be made. These results are in the table below:

TABLE 4

| Sample | Thickness (nm) | Refractive Index |
| --- | --- | --- |
| 2-A | 442 | 1.6 |
| 2-B | 451 | 1.6 |
| 2-C | 463 | 1.6 |
| 2-D | 660 | 1.6 |

For sample D a breakdown measurement was done on three areas of the sample. The average breakdown was 7.9 MV/cm, which shows that a high quality $Al_2O_3$ dielectric layer was formed.

Example 3

This example shows the production of a working transistor device using heavily doped silicon as the gate material but then employing $Al_2O_3$ as the dielectric and ZnO as the semiconductor, in which both of the latter materials are deposited using the present invention.

The aluminum oxide films were deposited first according to following conditions:

TABLE 5

| Sample | Trimethyl-Aluminum Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles |
|---|---|---|---|---|---|---|---|
| 3-A | 25 | 620 | 10 | 20 | 1100 | 1500 | 80 |
| 3-B | 25 | 620 | 10 | 20 | 1100 | 1500 | 60 |

After the aluminum oxide deposition, both samples were coated using the above apparatus with ZnO according to the following conditions:

TABLE 6

| Diethylzinc Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles |
|---|---|---|---|---|---|---|
| 5 | 620 | 5 | 10 | 1000 | 1500 | 20 |

Aluminum contacts were evaporated on the resulting multilayer device through a shadow mask, yielding thin film transistors with a channel length of 50 μm and a channel width of 500 μm. Results of the devices are shown below:

TABLE 7

| Sample | $Al_2O_3$ Thickness (nm) | Mobility ($cm^2$/Vs) | Vth (volts) |
|---|---|---|---|
| 3-A | 1330 | 2.4 | 9.7 |
| 3-B | 1068 | 1.1 | 9.4 |

The data above show that high quality thin film transistors can be produced by depositing all of the critical layers using the apparatus of this invention.

Example 4

This example shows the production of a working transistor device using heavily doped silicon as the gate material but then employing $Al_2O_3$ as the dielectric and ZnO as the semiconductor in which both of the latter materials are deposited according to the present invention, with variations in deposition temperature to demonstrate the capability to produce useful devices over a range of temperatures.

The aluminum oxide films were deposited first according to following conditions:

TABLE 8

| Sample | Trimethyl-Aluminum Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles | Temp. (C.) |
|---|---|---|---|---|---|---|---|---|
| 4-A | 5 | 620 | 10 | 25 | 1100 | 1500 | 175 | 200 |
| 4-B | 5 | 620 | 10 | 25 | 1100 | 1500 | 175 | 160 |
| 4-C | 5 | 620 | 10 | 25 | 1100 | 1500 | 100 | 160 |

After the aluminum oxide deposition, the samples were coated using the above apparatus with ZnO according to the following conditions:

TABLE 9

| Sample | Diethylzinc Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles | Temp. (C.) |
|---|---|---|---|---|---|---|---|---|
| 4-A | 5 | 620 | 10 | 10 | 1100 | 1500 | 20 | 200 |
| 4-B | 5 | 620 | 10 | 10 | 1100 | 1500 | 20 | 160 |
| 4-C | 5 | 620 | 10 | 10 | 1100 | 1500 | 20 | 160 |

Aluminum contacts were evaporated on the resulting multilayer device through a shadow mask, yielding thin film transistors with a channel length of 50 μm and a channel width of 500 μm. Results of the devices are shown below:

TABLE 10

| Sample | $Al_2O_3$ Thickness (nm) | Mobility (cm$^2$/Vs) | Vth (volts) |
|---|---|---|---|
| 4-A | 757 | 3.3 | 9.9 |
| 4-B | 988 | 1.5 | 11.0 |
| 4-C | 573 | 1.3 | 6.5 |

The data in the above table shows that good quality thin film transistors can be fabricated at various temperatures with the inventive apparatus.

Example 5

This example shows the production of an aluminum oxide film on a glass substrate, demonstrating that a variety of substrates can be used in this invention. The aluminum oxide films were deposited first according to following conditions:

TABLE 11

| Trimethyl-Alum. Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles |
|---|---|---|---|---|---|---|
| 5 | 620 | 10 | 25 | 1100 | 1500 | 175 |

Variations were made as to how the glass substrate was pretreated prior to deposition. Oxygen plasma treatments were performed in an SPI Plasma-Prep II® Plasma Etcher (West Chester, Pa.) running with a chamber pressure of approximately 100 mTorr. The Pirhana clean consists of immersion of the samples in a freshly prepared solution of 100 ml of 30% hydrogen peroxide in 200 ml of concentrated sulfuric acid. The table below lists the treatments and the resulting thickness of the samples:

TABLE 12

| Sample | Surface Treatment | $Al_2O_3$ Thickness (nm) |
|---|---|---|
| 5-A | Piranha clean 10' | 626 |
| 5-B | 2' O2 plasma treatment | 427 |
| 5-C | 2' O2 plasma treatment | 695 |
| 5-D | 5' O2 plasma treatment | 906 |

The above samples shows that films can be deposited on glass substrates, despite some thickness variations based upon surface pre treatment.

Example 6

This example shows the production of a working transistor device using indium tin oxide as the gate material but then employing $Al_2O_3$ as the dielectric and ZnO as the semiconductor, wherein both of the latter materials are deposited using the invention described in this patent. The aluminum oxide films were deposited first according to following conditions:

TABLE 13

| Trimethyl-Aluminum Bubbler flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles | Temp. (C.) |
|---|---|---|---|---|---|---|---|
| 16 | 620 | 10 | 25 | 1100 | 1500 | 175 | 200° C. |

After the aluminum oxide deposition, the samples were coated using the above apparatus with ZnO according to the following conditions:

TABLE 14

| Diethylzinc Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles | Temp. (C.) |
|---|---|---|---|---|---|---|---|
| 8.5 | 620 | 10 | 15 | 1100 | 1500 | 45 | 200 |

The samples were given various cleaning treatments as listed in the table below. The sonication in isopropyl alcohol (IPA) was done with a bench top ultrasonic cleaner, and consisted of sonication of the sample in IPA for 5 minutes. The $O_2$ Plasma/CFx treatment consisted of a 2' $O_2$ plasma treatment as described in Example 5 above, followed by deposition of a 1 nm fluorocarbon (CFx) layer by plasma-assisted deposition of $CHF_3$ as described in U.S. Pat. No. 6,208,075.

TABLE 15

| Sample | Substrate Preparation | Mobility | Vth |
|---|---|---|---|
| 6-A | Sonication in IPA | 1.2 | 3.8 |
| 6-B | $O_2$ Plasma/CFx | 2.8 | 3.8 |

The results shown above indicate that the apparatus of the invention can be used to produce stacked devices on ITO, indicating the possibility of full transparent devices.

Example 7

This example shows the capability to produce a conductive material according to the present invention. The conductor is an aluminum doped zinc oxide. The films were grown by simultaneous addition of diethylzinc and trimethylaluminum as shown in the table below:

TABLE 16

| Sample | Diethylzinc Bubbler Flow (sccm) | Trimethyl Aluminum Bubbler Flow (sccm) | Metal Precursor Dilution Flow (sccm) | Air Flow (sccm) | Water Bubbler Flow (sccm) | Oxidizer Dilution Flow (sccm) | Nitrogen Purge Flow (sccm) | Cycles | Temp (C.) |
|---|---|---|---|---|---|---|---|---|---|
| 3 | 30 | 2 | 620 | 10 | 15 | 1100 | 1500 | 300 | 350 |
| 6 | 30 | 2 | 620 | 10 | 15 | 1100 | 1500 | 300 | 200 |

Sample resistivities where measured by contacting an ohm-meter to the sample with probes spaced at approximately 0.5 cm. The results of this measurement are shown below:

TABLE 17

| Sample | Resistance |
|---|---|
| 3 | 8 kΩ |
| 6 | 450 kΩ |

The results above indicate that conductive films can be made using the present invention.

PARTS LIST

| | |
|---|---|
| 10 | distribution manifold |
| 12 | output channel |
| 14, 16, 18 | gas inlet port |
| 20 | substrate |
| 22 | partition |
| 24 | gas output port |
| 26 | exhaust port |
| 28a, 28b, 28c | gas supply |
| 30 | actuator |
| 32 | supply line |
| 36 | output face |
| 38 | redirecting plate |
| 40 | aperture |
| 42 | partition plate |
| 44 | delivery plate |
| 46a, 46b, 46c | duct |
| 48 | redirecting chamber |
| 50 | chamber |
| 52 | transport motor |
| 54 | transport subsystem |
| 56 | control logic processor |
| 58 | baffle |
| 60 | Atomic Layer Deposition (ALD) system |
| 62 | web conveyor |
| 64 | distribution manifold transport |
| 66 | web substrate |
| 70 | Atomic Layer Deposition (ALD) system |
| 72 | diffusion layer |
| 74 | substrate support |
| 81 | nitrogen gas flow |
| 82, 83, 84 | gas bubblers |
| 85, 86, 87, 88, 89, 91, 94 | flow meters |
| 90 | air flow |
| 92 | metal precursor flow |
| 93 | oxidizer-containing flow |
| 95 | nitrogen purge flow |
| 96 | gap |
| 97 | example substrate |
| 98 | arrow |
| D | distance |
| F1, F2, F3, F4, $F_I$, $F_O$, $F_M$, $F_E$ | gas flow |
| H | height |
| I | inert gaseous material |
| L | channel length |
| M | second reactant gaseous material |
| O | first reactant gaseous material |
| R | arrow |
| W | channel width |

The invention claimed is:

1. A distribution manifold for thin-film material deposition onto a substrate comprising:
   a) a plurality of inlet ports comprising at least a first, a second, and a third inlet port capable of receiving a first, a second, and a third gaseous material, respectively;
   b) an output face comprising a plurality of open elongated output channels, each channel extending in a length direction substantially in parallel, the output channels comprising at least a first, a second, and a third output channel wherein the output channels are adjacent to each other along the output face, each output channel comprising an output port, wherein each output port, which is used to provide a flow of gaseous material to the corresponding output channel, allows gaseous flow communication with one of the first, the second, or the third inlet ports and is capable of substantially directing a flow of the corresponding one of the first, the second, and the third gaseous material along the length direction of the output channel towards an end of the output channel whereby the gaseous material is exhausted from the output channel at a position displaced along the length of output channel from the output port.

2. The distribution manifold of claim 1 further comprising an actuator coupled to the body of the distribution manifold to provide reciprocating motion of the distribution manifold in a direction substantially orthogonal to the length direction of the output channel.

3. The distribution manifold of claim 1 wherein each elongated output channel has elongated sides which are defined by partition walls.

4. The distribution manifold of claim 3 wherein each elongated output channel is defined by two stacked side plates separated by a central plate, wherein portions of the side plates extending beyond the central plate, in a height direction perpendicular to the length direction, form the partition walls.

5. The distribution manifold of claim 3 wherein the width of the opening of at least one elongated output channel is between about 0.2 to 5 mm.

6. The distribution manifold of claim 1 wherein at least one output channel further comprises an exhaust port at one end of the output channel capable of drawing in the flow the gaseous material received in the output channel.

7. The distribution manifold of claim 6 wherein the exhaust port allows the gaseous material to be recycled for reuse.

8. The distribution manifold of claim 1 wherein the output face, in cross-section, has curvature.

9. The distribution manifold of claim 1 wherein, in cross-section, the output channels are rectangular.

10. The distribution manifold of claim 1 wherein the output port in each output channel is disposed in proximity to one end of the output channel.

11. The distribution manifold of claim 1 wherein the output port in each output channel is disposed approximately in the center of the output channel.

12. The distribution manifold of claim 1 wherein the plane of the opening of the output port in each output channel is inclined at an angle oblique to the length direction.

13. The distribution manifold of claim 1 wherein the output port in at least one output channel is under a baffle that directs the gaseous flow in the length direction.

14. The distribution manifold of claim 1 wherein there are no elongated channels, adjacent the elongated outlet channels, that are attached to a vacuum source.

15. The distribution manifold of claim 1 wherein at least one of the output channels are open at an elongated end thereof to allow the gaseous material received by the output channel to flow past the side of the distribution manifold or to be collected by a collection manifold.

16. A deposition system for thin film deposition of a solid material onto a substrate comprising:
  a) a plurality of sources for, respectively, a plurality of gaseous materials comprising at least a first, a second, and a third source for a first, a second, and a third gaseous material, respectively;
  b) a distribution manifold comprising:
    (i) a plurality of inlet ports comprising at least a first, a second, and a third inlet port for receiving the first, the second, and the third gaseous material, respectively;
    (ii) an output face comprising a plurality of open elongated output channels, each channel extending in a length direction substantially in parallel, the output channels comprising at least a first, a second, and a third output channel,
    wherein the output channels are adjacent to each other along the output face,
    each output channel having an output port,
    wherein each output port, which is used to provide a flow of gaseous material to the corresponding output channel, allows gaseous flow communication with one of the first, the second, and the third input ports and is capable of substantially directing a flow of the corresponding one of the first, the second, or the third gaseous material along the length direction of the output channel towards an end of the output channel whereby the gaseous material is exhausted from the output channel at a position displaced along the length of the output channel from the output port; and
  c) a substrate support for supporting a substrate in substantially uniform pre-designed close proximity to the output face of the distribution manifold,
  wherein the system is capable, during operation, of providing relative movement between the output face and the substrate surface while maintaining the pre-designed close proximity.

17. The deposition system according to claim 16 further comprising an actuator coupled to the distribution manifold to provide reciprocating motion of the distribution manifold in a direction substantially orthogonal to the length direction of the output channel, thereby providing the distribution manifold with an oscillating motion.

18. The deposition system according to claim 16 further comprising an actuator coupled to the substrate support to provide reciprocating motion of the substrate in a direction substantially orthogonal to the length direction of the output channel of the distribution manifold, thereby providing the substrate with an oscillating motion.

19. The deposition system according to claim 16 wherein the substrate support comprises a transport apparatus for moving the substrate along the output face of the distribution manifold.

20. The deposition system according to claim 19 wherein the movement of the web provided by the transport apparatus is continuous.

21. The deposition system according to claim 16 wherein the total surface area of the substrate for thin film deposition of the solid material exceeds the surface area of the output face of the distribution manifold.

22. The deposition system according to claim 16 wherein the substrate support conveys a moving web.

23. The deposition system according to claim 22 wherein the movement of the moving web provided by the transport apparatus is reciprocating.

24. The deposition system according to claim 16 wherein the substrate support maintains the substrate surface at a separation distance of within 0.4 mm of the output face of the distribution manifold.

25. The deposition system according to claim 16 wherein the flow of gaseous material in the first, the second, and the third output channel is substantially continuous during thin film deposition.

26. The deposition system according to claim 16 further comprising a chamber housing for the distribution manifold and substrate during thin film deposition.

27. The deposition system according to claim 16 wherein the substrate and the distribution manifold are open to the atmosphere.

28. The deposition system of claim 16 wherein each elongated output channel has elongated sides which are defined by partition walls.

29. The deposition system of claim 16 wherein each elongated output channel is defined by two stacked side plates separated by a central plate, wherein portions of the side plates extending beyond the central plate, in a height direction perpendicular to the length direction, form the partition walls.

30. A deposition apparatus for thin film deposition onto a substrate comprising:
- a) a plurality of sources for a plurality of gaseous materials, comprising at least a first, a second, and a third source for a first, a second, and a third gaseous material, respectively;
- b) a distribution manifold comprising:
  - (i) a plurality of inlet ports comprising at least a first, a second, and a third inlet port for receiving the first, the second, and the third gaseous material, respectively;
  - (ii) an output face comprising a plurality of open elongated output channels, each channel extending in a length direction substantially in parallel, the output channels comprising at least a first, a second and a third output channel wherein the output channels are adjacent to each other along the output face, each output channel having an output port, wherein each output port, which is used to provide a flow of gaseous material to the corresponding output channel, allows gaseous flow communication with one of the first, the second, and the third input port and is capable of substantially directing flow of the corresponding one of the first, the second, and the third gaseous materials along the length direction of the output channel towards an end of the output channel whereby the gaseous material is exhausted from the output channel at a position displaced along the length of the output channel from the output port; and
- c) a conveyer for moving a web substrate past the output face of the distribution manifold to effect thin film deposition over an area of the web substrate, wherein the web substrate is in substantially uniform pre-designed close proximity to the output face of the distribution manifold, and wherein, the system is capable, during operation of the system, of providing relative movement between the output face and substrate surface while maintaining the pre-designed close proximity.

31. The deposition apparatus of claim 30 further comprising a transport assembly for moving the distribution manifold in a direction transverse to web movement.

32. The deposition apparatus of claim 30 further comprising a web motion apparatus that reciprocates web motion between two opposite directions.

33. The deposition apparatus of claim 30 wherein the deposition apparatus is in unsealed relationship to ambient atmosphere.

\* \* \* \* \*